United States Patent
Ina et al.

(10) Patent No.: US 9,831,311 B2
(45) Date of Patent: Nov. 28, 2017

(54) SEMICONDUCTOR DEVICE AND METHOD OF MANUFACTURING THE SAME

(71) Applicant: TOYODA GOSEI CO., LTD., Kiyosu-shi (JP)

(72) Inventors: Tsutomu Ina, Kiyosu (JP); Tohru Oka, Kiyosu (JP)

(73) Assignee: Toyoda Gosei Co., Ltd., Kiyosu-shi, Aichi-ken (JP)

(*) Notice: Subject to any disclaimer, the term of this patent is extended or adjusted under 35 U.S.C. 154(b) by 38 days.

(21) Appl. No.: 14/853,867

(22) Filed: Sep. 14, 2015

(65) Prior Publication Data
US 2016/0093703 A1  Mar. 31, 2016

(30) Foreign Application Priority Data
Sep. 26, 2014  (JP) .................... 2014-196498

(51) Int. Cl.
| | | |
|---|---|---|
| *H01L 29/15* | (2006.01) | |
| *H01L 29/20* | (2006.01) | |
| *H01L 29/417* | (2006.01) | |
| *H01L 29/51* | (2006.01) | |
| *H01L 29/66* | (2006.01) | |
| *H01L 29/78* | (2006.01) | |

(52) U.S. Cl.
CPC .... *H01L 29/2003* (2013.01); *H01L 29/41741* (2013.01); *H01L 29/513* (2013.01); *H01L 29/66734* (2013.01); *H01L 29/7813* (2013.01)

(58) Field of Classification Search
CPC .......... H01L 29/2003; H01L 29/41741; H01L 29/513; H01L 29/66734; H01L 29/7813
See application file for complete search history.

(56) References Cited

U.S. PATENT DOCUMENTS

| | | | |
|---|---|---|---|
| 5,563,422 A | 10/1996 | Nakamura et al. | |
| 2013/0277680 A1* | 10/2013 | Green ................... | H01L 29/402 257/76 |
| 2015/0137135 A1* | 5/2015 | Green ................... | H01L 29/872 257/76 |

FOREIGN PATENT DOCUMENTS

JP    H 07-221103 A    8/1995

* cited by examiner

*Primary Examiner* — Victor A Mandala
*Assistant Examiner* — Colleen E Snow
(74) *Attorney, Agent, or Firm* — McGinn IP Law Group, PLLC

(57) ABSTRACT

A semiconductor device includes: a semiconductor layer; a first electrode that is in ohmic contact with part of the semiconductor layer; an insulating film that is formed over from the semiconductor layer to the first electrode and has an opening area on an inner side of a first edge of the first electrode; a second electrode that is located at a position different from the first electrode and is formed on at least one of the insulating film and the semiconductor layer; and a third electrode that is made of an identical component with a component of the second electrode and is formed on the first electrode through the opening area and is also formed over from the first electrode to an inner side of the first edge on the insulating film.

11 Claims, 26 Drawing Sheets

SEMICONDUCTOR DEVICE AND METHOD OF MANUFACTURING THE SAME

CROSS-REFERENCE TO RELATED APPLICATION

The present application claims priority from Japanese patent application P2014-196498 filed on Sep. 26, 2014, the entirety of disclosures of which is hereby incorporated by reference into this application.

BACKGROUND

1. Technical Field

The present invention relates to a semiconductor device and a method of manufacturing the same.

2. Related Art

In known techniques of manufacturing a semiconductor device, there is a technique for forming an electrode having ohmic characteristics (ohmic electrode) on a semiconductor layer (see, for example, JP H07-221103A). In general, the ohmic electrode formed on the semiconductor layer is required to reduce the contact resistance while ensuring the adhesion to the semiconductor layer.

SUMMARY

Conventionally there is a problem when dry etching is performed after formation of an ohmic electrode. Dry etching damages the ohmic electrode and thereby increases the contact resistance of the ohmic electrode. A measure to solve this problem forms a protective layer for protecting the ohmic electrode, prior to dry etching. This technique, however, has a problem of increasing the manufacturing cost to form the protective layer, as well as a problem of expanding the semiconductor device size due to an area to be provided for formation of the protective layer (design margin). With respect to the semiconductor device and a method of manufacturing the same, other needs include resource saving, improved usability and improved durability.

In order to solve at least part of the problems described above, the invention may be implemented by the following aspects.

(1) According to one aspect of the invention, there is provided a semiconductor device. This semiconductor device comprises a semiconductor layer; a first electrode that is in ohmic contact with part of the semiconductor layer; an insulating film that is formed over from the semiconductor layer to the first electrode and has an opening area on an inner side of a first edge of the first electrode; a second electrode that is located at a position different from the first electrode and is formed on at least one of the insulating film and the semiconductor layer; and a third electrode that is made of an identical component with a component of the second electrode and is formed on the first electrode through the opening area and is also formed over from the first electrode to an inner side of the first edge on the insulating film. According to the semiconductor device of this aspect, a manufacturing method may be applied to separate an electrode layer formed over from the insulating film to the first electrode into the second electrode and the third electrode by dry etching. Applying this manufacturing method enables the insulating film and the third electrode to protect the first electrode from dry etching and thereby ensures the sufficient ohmic characteristics of the first electrode. The insulating film is provided to cover the first edge. Compared with a configuration that the third electrode is provided to cover over the entire first electrode, this configuration suppresses expansion of the semiconductor device size due to the design margin in formation of the second electrode. This configuration thus ensures the sufficient ohmic characteristics of the first electrode, while reducing the manufacturing cost and allowing for miniaturization of the semiconductor device.

(2) In the semiconductor device of the above aspect, the insulating film may include a first insulating layer that is formed over from the semiconductor layer to the first electrode, and a second insulating layer that is formed on the first insulating layer. According to this aspect, the characteristics required for the insulating film (for example, interface state, leak current and permittivity) are provided by the combination of the characteristics of the first insulating layer with the characteristics of the second insulating layer.

(3) In the semiconductor device of the above aspect, the insulating film may include a first insulating layer that is formed on the semiconductor layer, and a second insulating layer that is formed over the first insulating layer to the first electrode. According to this aspect, a manufacturing method may be applied to form the first electrode after formation of the first insulating layer. Applying this manufacturing method enables the first insulating layer to protect the surface of the semiconductor layer from contamination in the process of forming the first electrode. This accordingly suppresses the interfacial characteristics from being deteriorated with an increase in interface state density between the semiconductor layer and the insulating film.

(4) In the semiconductor device of the above aspect, a component of the first insulating layer may be different from a component of the second insulating layer. According to this aspect, the characteristics required for the insulating film are provided by the combination of the characteristics derived from the respective components of the first insulating layer and the second insulating layer.

(5) In the semiconductor device of the above aspect, the first electrode may be a source electrode, and the second electrode may be a gate electrode. This aspect ensures the sufficient ohmic characteristics of the source electrode, while reducing the manufacturing cost and reducing the semiconductor device size with respect to a trench MOSFET (metal oxide semiconductor field effect transistor).

(6) In the semiconductor device of the above aspect, the semiconductor layer may include a p-type semiconductor layer and an n-type semiconductor layer that is adjacent to the p-type semiconductor layer and has a surface on which the first electrode is formed. The semiconductor device may further comprise a fourth electrode that is formed on the p-type semiconductor layer. This aspect causes the fourth electrode to form a body diode.

(7) In the semiconductor device of the above aspect, the first electrode may be provided to be in contact with the fourth electrode. This aspect suppresses expansion of the semiconductor device size due to the design margin in formation of the fourth electrode.

(8) In the semiconductor device of the above aspect, the opening area of the insulating film may be located on an inner side of an edge of the fourth electrode. According to this aspect, the insulating film serves to protect a specific part of the first electrode that is in contact with the semiconductor layer, from the process of forming the opening area in the insulating film. This further reduces the contact resistance of the first electrode.

(9) In the semiconductor device of the above aspect, the semiconductor layer may be mainly made of gallium nitride (GaN). This aspect ensures the sufficient ohmic characteristics of the first electrode, while reducing the manufacturing cost and reducing the semiconductor device size with respect to a gallium nitride-based semiconductor device.

(10) According to another aspect of the invention, there is provided a method of manufacturing a semiconductor device. The method of manufacturing comprises forming a semiconductor layer; forming a first electrode that is in ohmic contact with part of the semiconductor layer; forming an insulating film over from the semiconductor layer to the first electrode; forming an opening area in the insulating film to expose the first electrode on an inner side of a first edge of the first electrode; forming an electrode layer over from the insulating film to the first electrode; and separating the electrode layer by dry etching into a second electrode that is located at a different position from the first electrode and is formed on at least one of the insulating film and the semiconductor layer and a third electrode that is formed over from the first electrode to an inner side of the first edge on the insulating film. According to this aspect, the insulating film and the third electrode are provided to protect the first electrode from dry etching, so as to ensure the sufficient ohmic characteristics of the first electrode. The insulating film is provided to cover the first edge. Compared with a configuration that the third electrode is provided to cover over the entire first electrode, this configuration suppresses expansion of the semiconductor device size due to the design margin in formation of the second electrode. This configuration thus ensures the sufficient ohmic characteristics of the first electrode, while reducing the manufacturing cost and allowing for miniaturization of the semiconductor device.

(11) The method of manufacturing according to the above aspect may further comprise forming a first insulating layer on the semiconductor layer as part of the insulating film, prior to forming the first electrode; forming a first opening area in the first insulating layer to expose the semiconductor layer; forming the first electrode on the semiconductor layer exposed from the first opening area; forming a second insulating layer as part of the insulating film over from the first insulating layer to the first electrode; and forming a second opening area in the second insulating layer, as the opening area. This aspect enables the first insulating layer to protect the surface of the semiconductor layer from contamination in the process of forming the first electrode. This accordingly suppresses the interfacial characteristics from being deteriorated with an increase in interface state density between the semiconductor layer and the insulating film.

(12) In the method of manufacturing according to the above aspect, a mask used for formation of the first opening area may be utilized to form the first electrode. According to this aspect, the first electrode is formed by self-alignment. This suppresses expansion of the semiconductor device size due to the design margin. The self-alignment eliminates the need to separately provide a mask for formation of the first electrode, thus reducing the manufacturing cost.

According to the above aspects of the invention, the insulating film and the third electrode are formed to protect the first electrode from dry etching, so as to ensure the sufficient ohmic characteristics of the first electrode. The insulating film is provided to cover the first edge. Compared with a configuration that the third electrode is provided to cover over the entire first electrode, this configuration suppresses expansion of the semiconductor device size due to the design margin in formation of the second electrode. This configuration thus ensures the sufficient ohmic characteristics of the first electrode, while reducing the manufacturing cost and reducing the semiconductor device size.

BRIEF DESCRIPTION OF DRAWINGS

The invention will be described with reference to the accompanying drawings in which.

DESCRIPTION OF EMBODIMENTS

A. First Embodiment

A-1. Structure of Semiconductor Device

Figure 1:
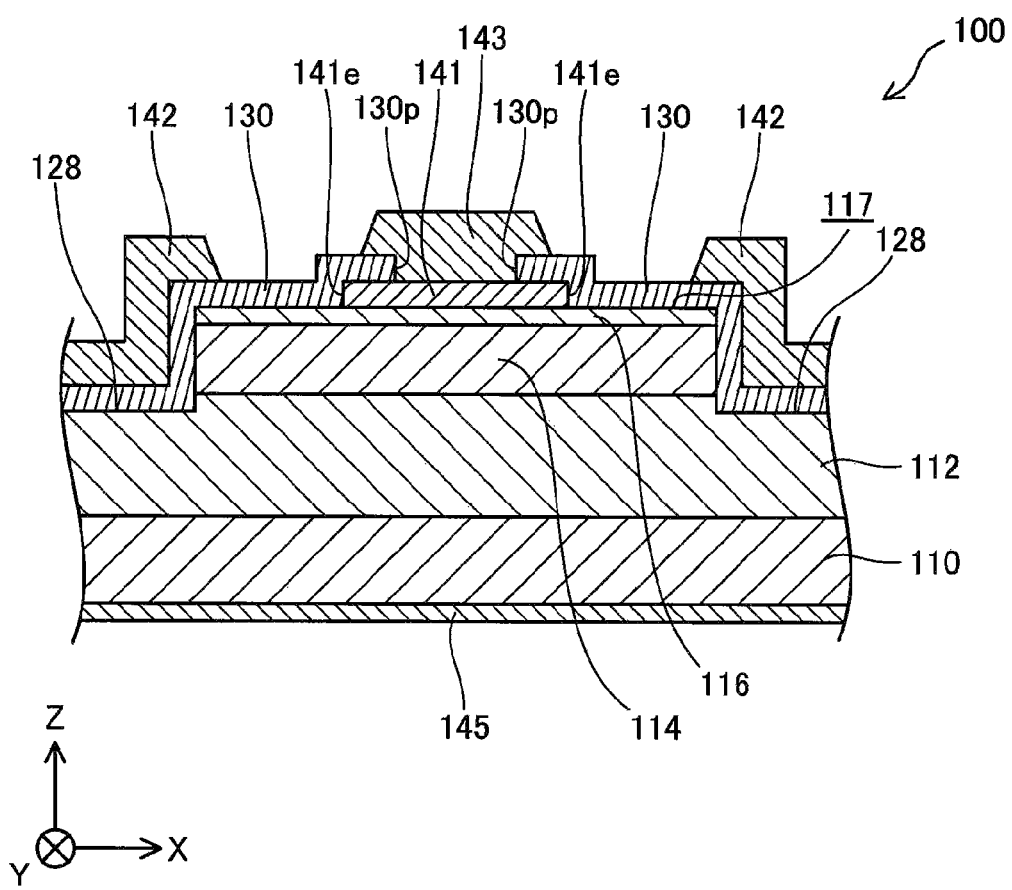
FIG. 1 is a sectional view schematically illustrating the structure of a semiconductor device according to a first embodiment.

FIG. 1 is a sectional view schematically illustrating the structure of a semiconductor device 100 according to a first embodiment. The semiconductor device 100 is a GaN-based semiconductor device formed by using gallium nitride (GaN). According to this embodiment, the semiconductor device 100 is a vertical trench MOSFET (metal oxide semiconductor field effect transistor). According to this embodiment, the semiconductor device 100 is used for power control and is also called power device.

XYZ axes orthogonal to one another are illustrated in FIG. 1. Among the XYZ axes in FIG. 1, the X axis is an axis going from the left side of the sheet surface to the right side of the sheet surface of FIG. 1; +X-axis direction is a direction going rightward on the sheet surface and −X-axis direction is a direction going leftward on the sheet surface. Among the XYZ axes in FIG. 1, the Y axis is an axis going from the front side of the sheet surface to the rear side of the sheet surface of FIG. 1; +Y-axis direction is a direction going backward on the sheet surface and −Y-axis direction is a direction going forward on the sheet surface. Among the XYZ axes in FIG. 1, the Z axis is an axis going from the lower side of the sheet surface to the upper side of the sheet surface of FIG. 1; +Z-axis direction is a direction going upward on the sheet surface and −Z-axis direction is a direction going downward on the sheet surface.

The semiconductor device 100 includes a substrate 110, a semiconductor layer 112, a semiconductor layer 114 and a semiconductor layer 116. The semiconductor device 100 has a trench 128 as a structure formed in these semiconductor layers 112, 114 and 116. The semiconductor device 100 further includes an insulating film 130, a source electrode 141, a gate electrode 142, a protective electrode 143 and a drain electrode 145.

The substrate 110 of the semiconductor device 100 is a semiconductor formed in a plate-like shape extended along both the X axis and the Y axis. According to this embodiment, the substrate 110 is mainly made of gallium nitride (GaN). In the description of this specification, the wording "mainly made of gallium nitride (GaN)" means containing gallium nitride (GaN) at a molar fraction of not lower than 90%. According to this embodiment, the substrate 10 is an n-type semiconductor containing silicon (Si) as the donor element.

The semiconductor layer 112 of the semiconductor device 100 is a first semiconductor layer located on the +Z-axis direction side of the substrate 110 and extended along the X axis and the Y axis. According to this embodiment, the semiconductor layer 112 is mainly made of gallium nitride (GaN). According to this embodiment, the semiconductor layer 112 is an n-type semiconductor containing silicon (Si) as the donor element. According to this embodiment, the average concentration of silicon (Si) included in the semiconductor layer 112 is about $1.0 \times 10^{16}$ cm$^{-3}$. According to this embodiment, the semiconductor layer 112 has thickness (length in the Z-axis direction) of about 10 μm (micrometers). According to this embodiment, the semiconductor layer 112 is a layer formed on the substrate 110 by metal organic chemical vapor deposition (MOCVD).

The semiconductor layer 114 of the semiconductor device 100 is a second semiconductor layer located on the +Z-axis direction side of the semiconductor layer 112 and extended along the X axis and the Y axis. According to this embodiment, the semiconductor layer 114 is mainly made of gallium nitride (GaN). According to this embodiment, the semiconductor layer 114 is a p-type semiconductor containing magnesium (Mg) as the acceptor element. According to this embodiment, the average concentration of magnesium (Mg) included in the semiconductor layer 114 is about $1.0 \times 10^{18}$ cm$^{-3}$. According to this embodiment, the semiconductor layer 114 has thickness (length in the Z-axis direction) of about 1.0 μm. According to this embodiment, the semiconductor layer 114 is a layer formed on the semiconductor layer 112 by MOCVD.

The semiconductor layer 116 of the semiconductor device 100 is a third semiconductor layer located on the +Z-axis direction side of the semiconductor layer 114 and extended along the X axis and the Y axis. The semiconductor layer 116 has a surface 117 that is adjacent to the trench 128. According to this embodiment, the surface 117 faces in the +Z-axis direction. According to this embodiment, the semiconductor layer 116 is mainly made of gallium nitride (GaN). According to this embodiment, the semiconductor layer 116 is an n-type semiconductor containing silicon (Si) as the donor element. According to this embodiment, the average concentration of silicon (Si) included in the semiconductor layer 116 is about $3.0 \times 10^{18}$ cm$^{-3}$. According to this embodiment, the semiconductor layer 116 has thickness (length in the Z-axis direction) of about 0.2 μm. According to this embodiment, the semiconductor layer 116 is a layer formed on the semiconductor layer 114 by MOCVD.

The trench 128 of the semiconductor device 100 is a groove recessed in the thickness direction (−Z axis direction) of the semiconductor layers 112, 114 and 116 from the semiconductor layer 116 to pass through the semiconductor layer 114 and enter the semiconductor layer 112. According to this embodiment, the trench 128 is a structure formed by dry etching of the semiconductor layers 112, 114 and 116.

The insulating film 130 of the semiconductor device 100 is a film having electrical insulating characteristics. The insulating film 130 is formed over from the trench 128 through the surface 117 of the semiconductor layer 116 to the source electrode 141. The insulating film 130 has an opening edge 130p located on an inner side of an edge 141e of the source electrode 141. According to this embodiment, the insulating film 130 is mainly made of silicon dioxide (SiO$_2$). According to this embodiment, the insulating film 130 is a film formed by atomic layer deposition (ALD).

The source electrode 141 of the semiconductor device 100 is a first electrode that is in ohmic contact with part of the surface 117 of the semiconductor layer 116. The edge 141e is covered by the insulating film 130. According to this embodiment, the source electrode 141 is an electrode formed by stacking a layer made of aluminum (Al) on a layer made of titanium (Ti) and subsequently treating the stacked layers by annealing process (heat treatment).

The gate electrode 142 of the semiconductor device 100 is a second electrode formed in the trench 128 via the insulating film 130. According to this embodiment, the gate electrode 142 is mainly made of aluminum (Al). When a voltage is applied to the gate electrode 142, an inversion layer is formed in the semiconductor layer 114 and serves as a channel, so as to form a conductive path between the source electrode 141 and the drain electrode 145.

The drain electrode 145 of the semiconductor device 100 is an electrode formed on a −Z-axis direction side surface of the substrate 110. The drain electrode 145 is in ohmic contact with the substrate 110. According to this embodiment, the drain electrode 145 is an electrode formed by stacking a layer made of aluminum (Al) on a layer made of titanium (Ti) and subsequently treating the stacked layers by annealing process (heat treatment).

Figure 2:
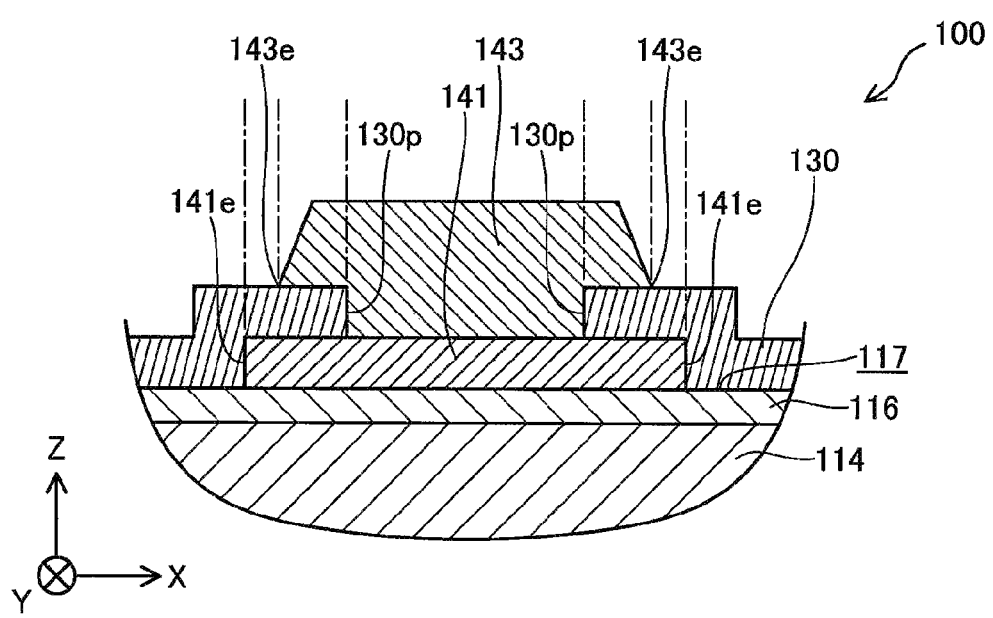
FIG. 2 is a partial sectional view schematically illustrating the structure of the semiconductor device, mainly focused on a protective electrode.

FIG. 2 is a partial sectional view schematically illustrating the structure of the semiconductor device 100, mainly focused on the protective electrode 143. The protective electrode 143 of the semiconductor device 100 is a third electrode that is formed on the source electrode 141 through an opening area defined by the opening edge 130*p* of the insulating film 130 and that is formed over from the source electrode 141 to the inner side of the edge 141*e* on the insulating film 130. The protective electrode 143 has an edge 143*e* that is located between the opening edge 130*p* of the insulating film 130 and the edge 141*e*. The protective electrode 143 is made of a component identical with the component of the gate electrode 142. According to this embodiment, the protective electrode 143 is mainly made of aluminum (Al).

A-2. Manufacturing Method of Semiconductor Device

Figure 3:
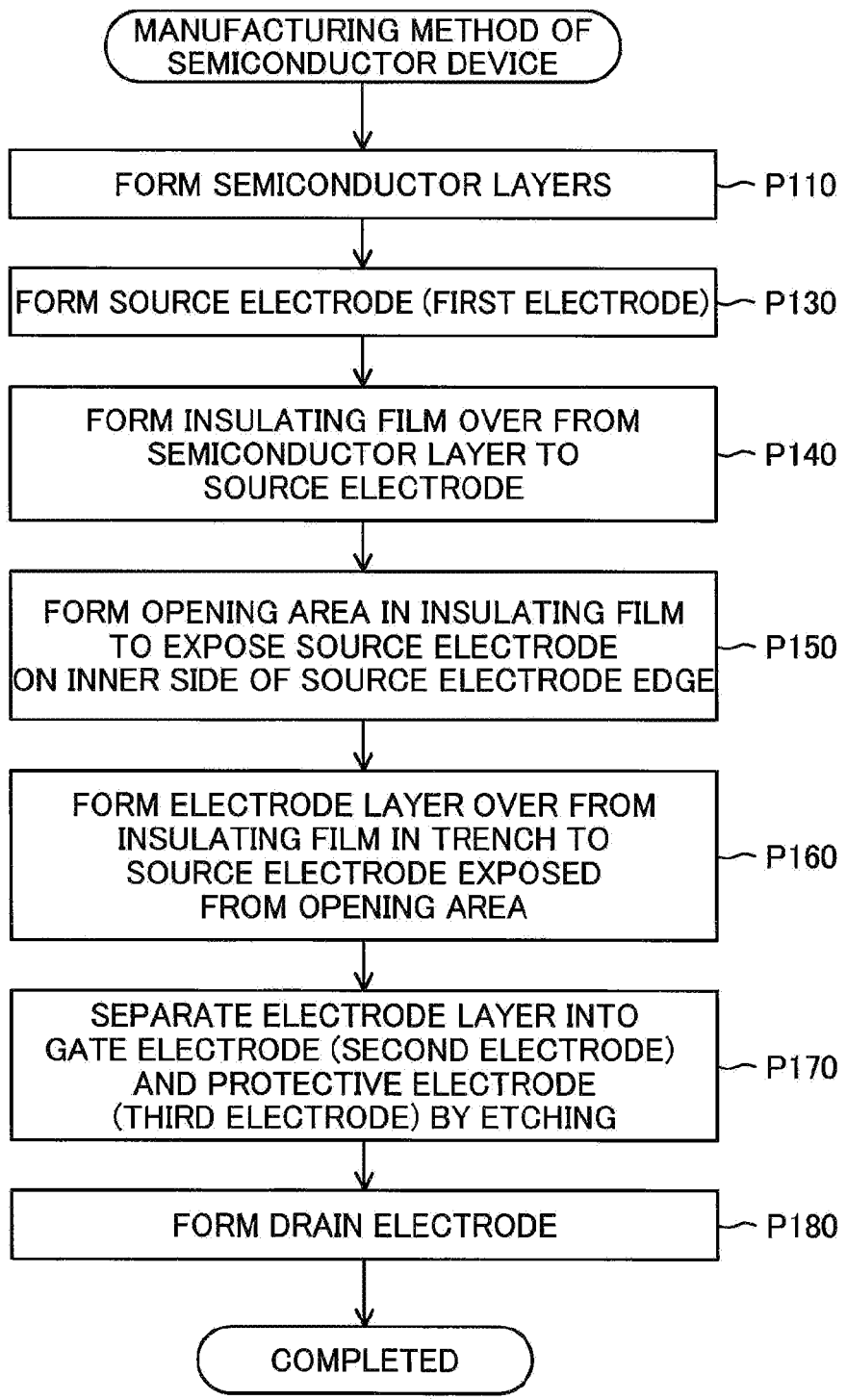
FIG. 3 is a flowchart showing a manufacturing method of the semiconductor device according to the first embodiment.

FIG. 3 is a flowchart showing a manufacturing method of the semiconductor device 100 according to the first embodiment. The manufacturer first forms the semiconductor layers 112, 114 and 116 having the surface 117 and the trench 128 (process P110).

Figure 4:
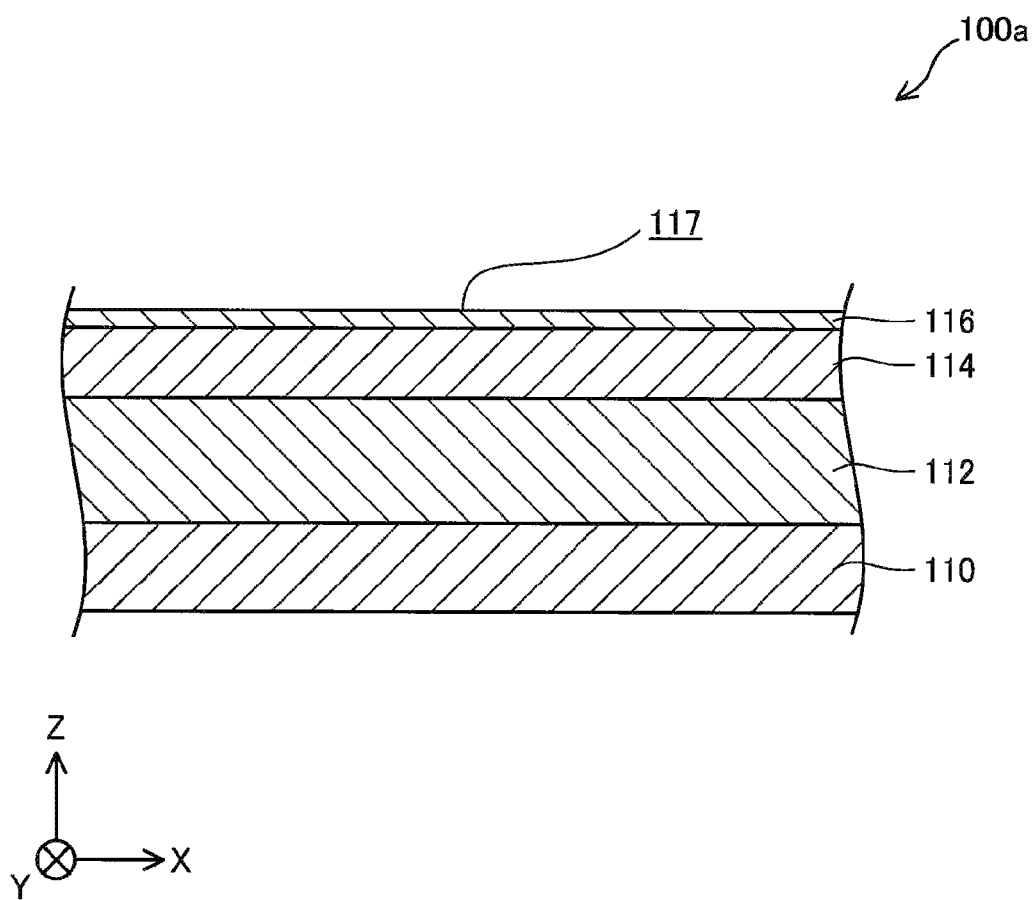
FIG. 4 is a sectional view schematically illustrating the structure of a semiconductor device in the course of manufacture.

FIG. 4 is a sectional view schematically illustrating the structure of a semiconductor device 100*a* in the course of manufacture at the process P110. According to this embodiment, the manufacturer forms the semiconductor layers 112, 114 and 116 on the substrate 110 by MOCVD. The manufacturer accordingly obtains the semiconductor device 100*a* in which the semiconductor layers 112, 114 and 116 are sequentially formed on the substrate 110. The semiconductor layer 116 of the semiconductor device 110*a* has the surface 117 facing in the +Z-axis direction.

Figure 5:
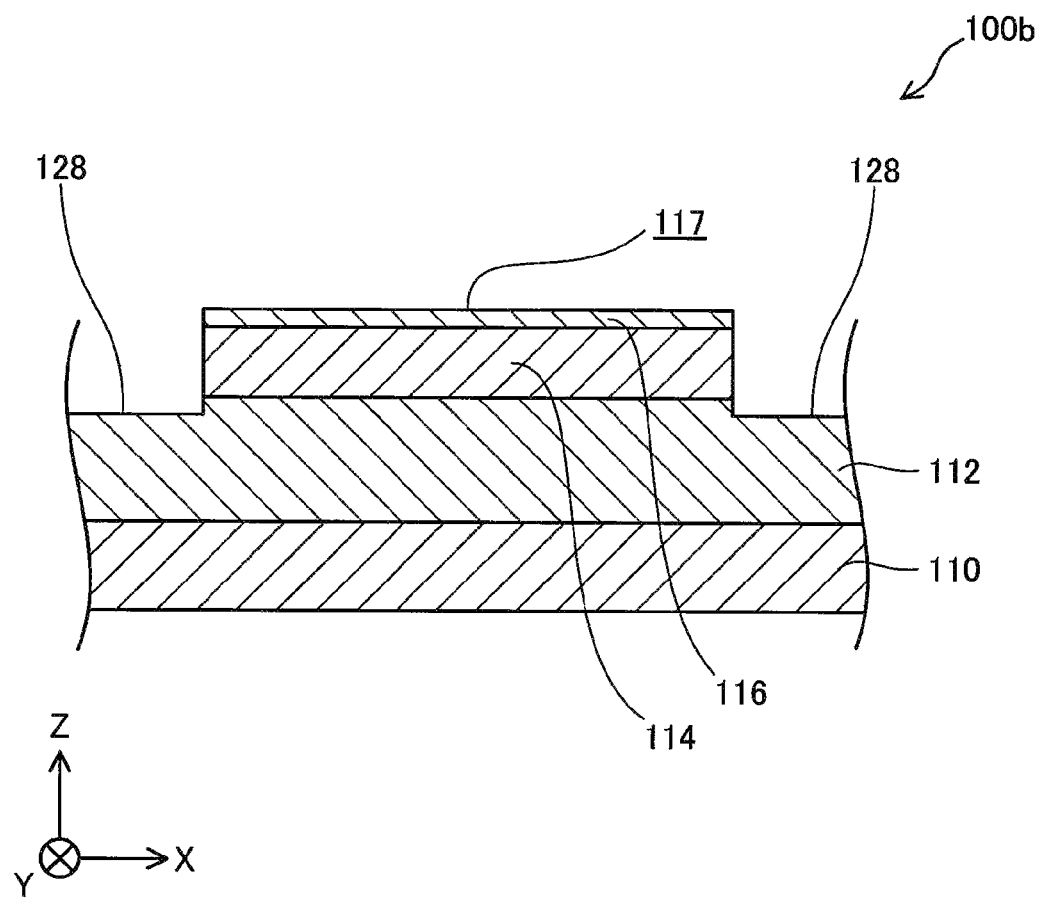
FIG. 5 is a sectional view schematically illustrating the structure of a semiconductor device in the course of manufacture.

FIG. 5 is a sectional view schematically illustrating the structure of a semiconductor device 100*b* in the course of manufacture at the process P110. According to this embodiment, the manufacturer forms the trench 128 in the semiconductor device 100*a* by dry etching. The manufacturer accordingly obtains the semiconductor device 100*b* in which the trench 128 is formed. The semiconductor device 100*b* includes the semiconductor layers 112, 114 and 116 having the surface 117 and the trench 128.

Referring back to FIG. 3, after forming the trench 128 in the semiconductor layers 112, 114 and 116 (process P110), the manufacturer forms the source electrode 141 in an inner area of the surface 117 of the semiconductor layer 116 (process P130). According to this embodiment, the manufacturer forms the source electrode 141 by stacking a layer made of aluminum (Al) on a layer made of titanium (Ti) and subsequently treating the stacked layers by annealing process (heat treatment).

Figure 6:
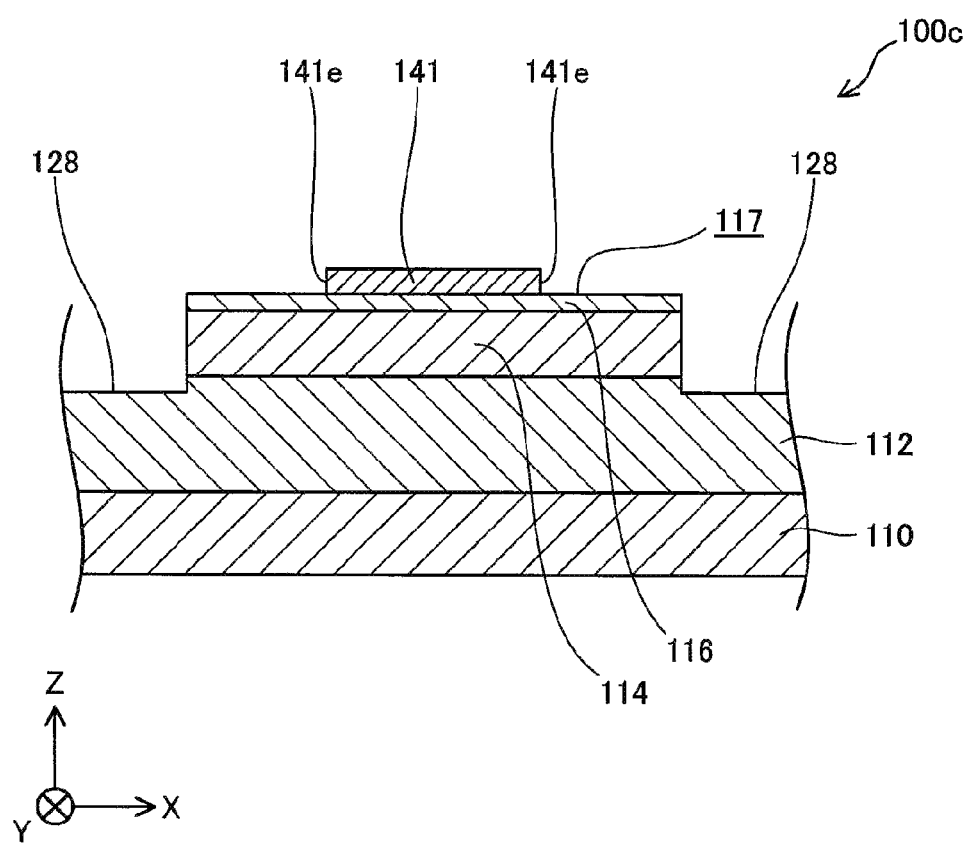
FIG. 6 is a sectional view schematically illustrating the structure of a semiconductor device in the course of manufacture.

FIG. 6 is a sectional view schematically illustrating the structure of a semiconductor device 100*c* in the course of manufacture at the process P130. According to this embodiment, the manufacturer forms the source electrode 141 on the surface 117 of the semiconductor device 100*b*. The manufacturer accordingly obtains the semiconductor device 100*c* in which the source electrode 141 is formed on the surface 117. In the semiconductor device 100*c*, the edge 141*e* is located on the surface 117.

Referring back to FIG. 3, after forming the source electrode 141 (process P130), the manufacturer forms the insulating film 130 over from the trench 128 through the surface 117 to the source electrode 141 (process P140). According to this embodiment, the manufacturer employs atomic layer deposition (ALD) to form the insulating film 130 that is mainly made of silicon dioxide ($SiO_2$).

Figure 7:
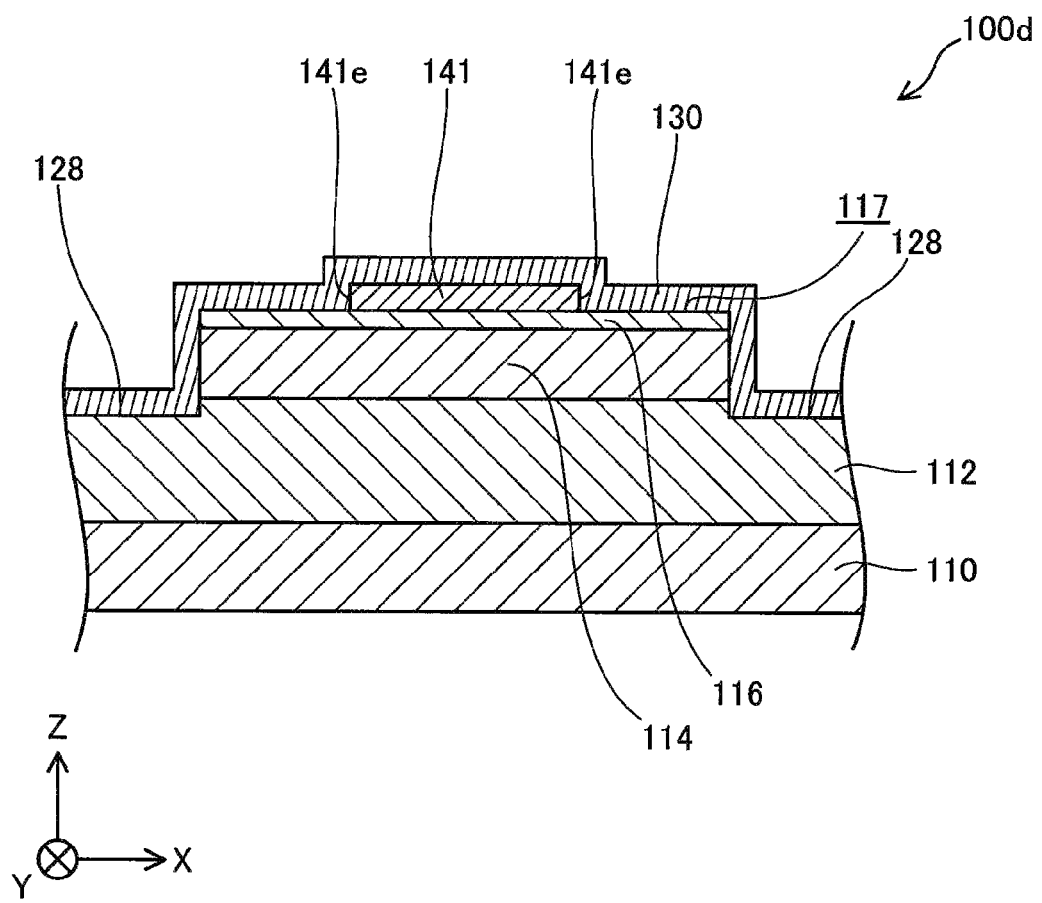
FIG. 7 is a sectional view schematically illustrating the structure of a semiconductor device in the course of manufacture.

FIG. 7 is a sectional view schematically illustrating the structure of a semiconductor device 100*d* in the course of manufacture at the process P140. According to this embodiment, the manufacturer forms the insulating film 130 over an entire +Z-axis direction side surface of the semiconductor device 100*c*. The manufacturer accordingly obtains the semiconductor device 100*d*, in which the insulating film 130 is formed over the entire +Z-axis direction side surface.

Referring back to FIG. 3, after forming the insulating film 130 (process P140), the manufacturer forms an opening area in the insulating film 130 to expose the source electrode 141 on the inner side of the edge 141*e* (process P150). According to this embodiment, the manufacturer forms the opening area defined by the opening edge 130*p* in the insulating film 130 by wet etching.

Figure 8:
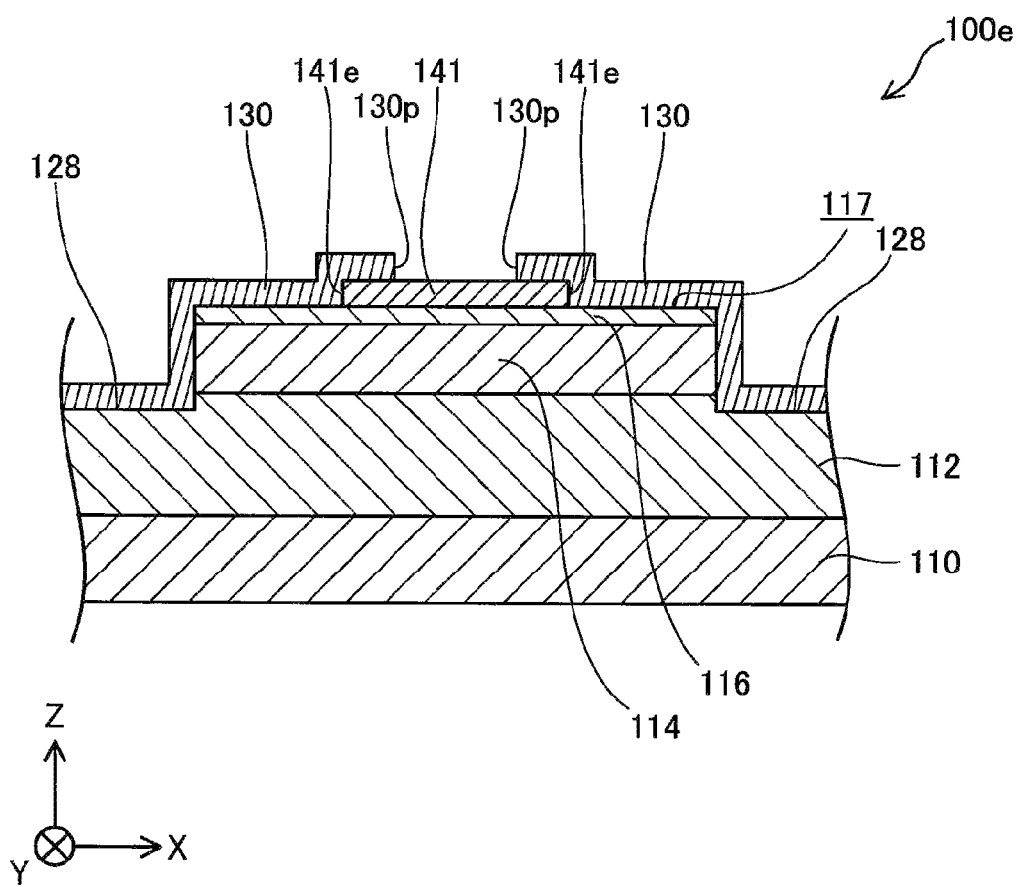
FIG. 8 is a sectional view schematically illustrating the structure of a semiconductor device in the course of manufacture.

FIG. 8 is a sectional view schematically illustrating the structure of a semiconductor device 100*e* in the course of manufacture at the process P150. According to this embodiment, the manufacturer removes part of the insulating film 130 of the semiconductor device 100*d* by wet etching, so as to make the source electrode 141 exposed from the insulating film 130 on the inner side of the edge 141*e*. The manufacturer accordingly obtains the semiconductor device 100*e*, in which the opening area is formed in the insulating film 130. The opening edge 130*p* of the semiconductor device 100*e* is located on the inner side of the edge 141*e*.

Figure 9:
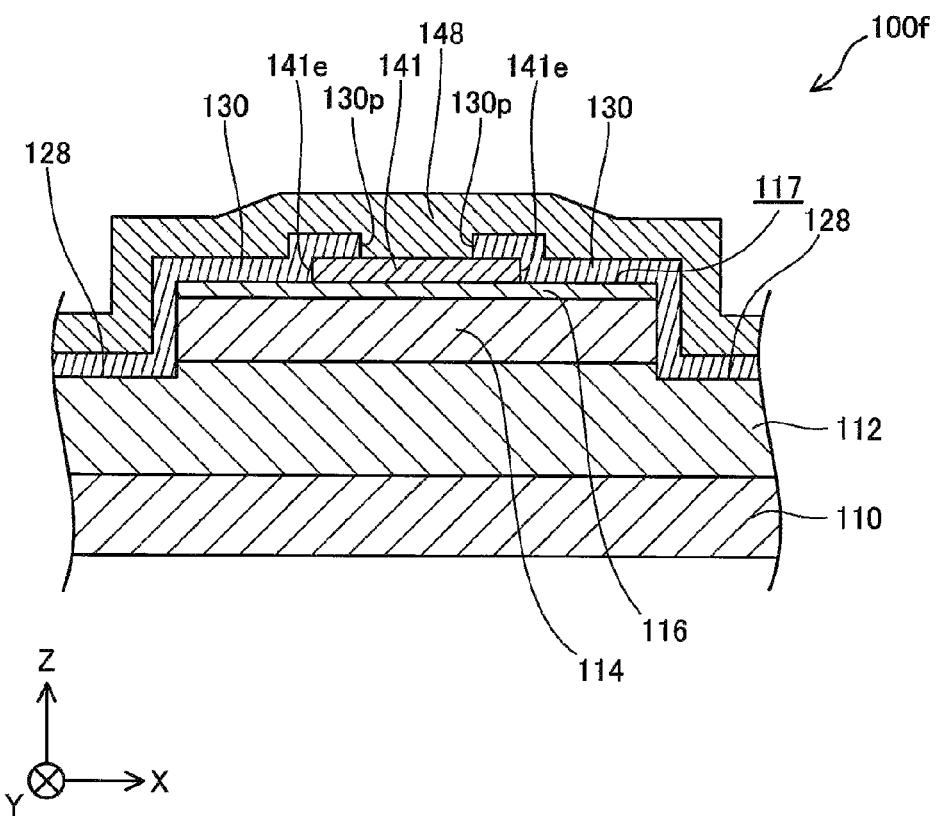
FIG. 9 is a sectional view schematically illustrating the structure of a semiconductor device in the course of manufacture.

FIG. 9 is a sectional view schematically illustrating the structure of a semiconductor device 100*f* in the course of manufacture at a process P160. After forming the opening area in the insulating film 130 (process P150), the manufacturer forms an electrode layer 148, as the base of the gate electrode 142 and the protective electrode 143, over from the insulating film 130 in the trench 128 through the insulating film 130 on the surface 117 to the source electrode 141 exposed from the opening area to the insulating film 130 (process P160). According to this embodiment, the manufacturer forms the electrode layer 148 mainly made of aluminum (Al) over an entire +Z-axis direction side surface of the semiconductor device 100*e* by sputtering. The manufacturer accordingly obtains the semiconductor device 100*f*, in which the electrode layer 148 is formed over the entire +Z-axis direction side surface.

Referring back to FIG. 3, after forming the electrode layer 148 (process P160), the manufacturer separates the electrode layer 148 into the gate electrode 142 and the protective electrode 143 by dry etching (process P170). According to this embodiment, the manufacturer removes part of the electrode layer 148 from between the opening edge 130*p* and the edge 141*e* to the neighborhood of the trench 128 by dry etching, so as to form the gate electrode 142 and the protective electrode 143 as remaining parts of the electrode layer 148 left by dry etching. The gate electrode 142 is a remaining part of the electrode layer 148 left by dry etching to be provided from inside to outside of the trench 128. The protective electrode 143 is a remaining part of the electrode layer 148 left by dry etching to be provided over from the source electrode 141 to the inner side of the edge 141e on the insulating film 130. Leaving the protective electrode 143 on the source electrode 141 in this way protects the source electrode 141 from dry etching.

Figure 10:
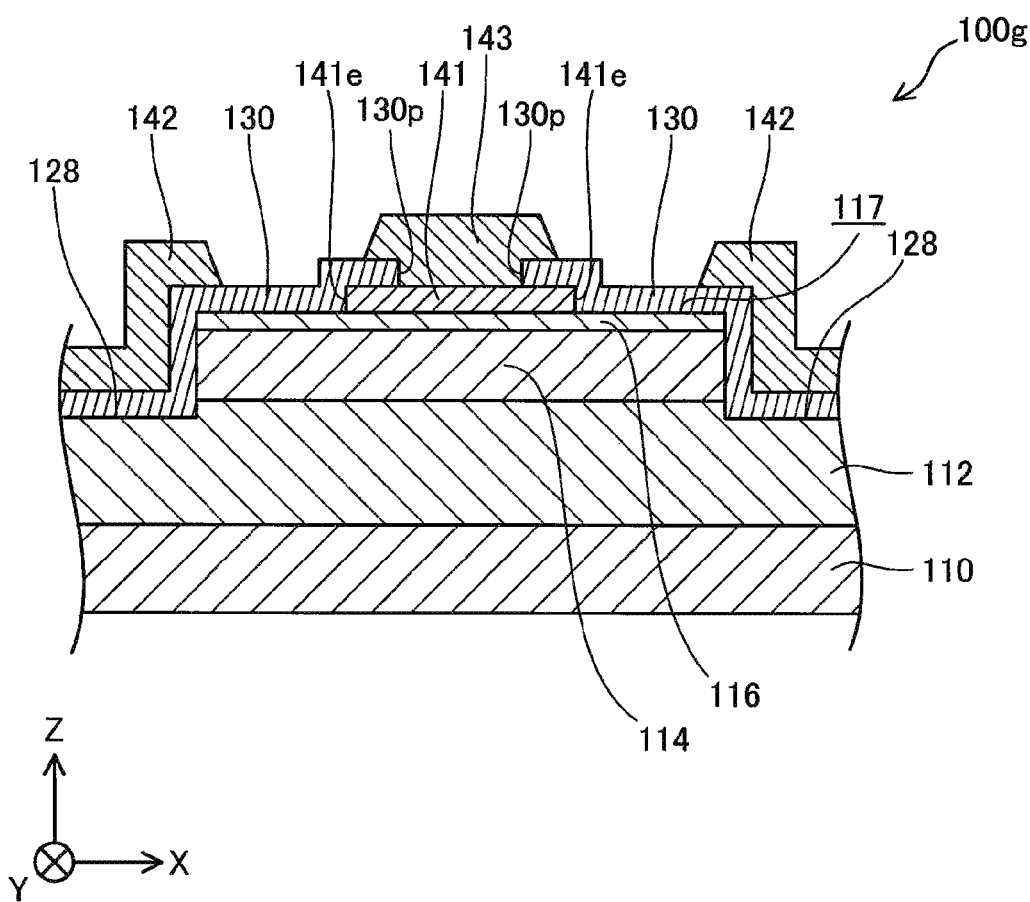
FIG. 10 is a sectional view schematically illustrating the structure of a semiconductor device in the course of manufacture.

FIG. 10 is a sectional view schematically illustrating the structure of a semiconductor device 100g in the course of manufacture at the process P170. According to this embodiment, the manufacturer removes part of the electrode layer 148 in the semiconductor device 100f by dry etching, so as to separate the electrode layer 148 into the gate electrode 142 and the protective electrode 143. The manufacturer accordingly obtains the semiconductor device 100g, in which the gate electrode 142 and the protective electrode 143 are formed.

Referring back to FIG. 3, after forming the gate electrode 142 and the protective electrode 143 (process P170), the manufacturer forms the drain electrode 145 on the −Z-axis direction side of the substrate 110 (process P180). According to this embodiment, the manufacturer forms the drain electrode 145 by stacking a layer made of aluminum (Al) on a layer made of titanium (Ti) and subsequently treating the stacked layers by annealing process (heat treatment). The semiconductor device 100 is completed through the above series of processes.

A-3. Advantageous Effects

In the first embodiment described above, the insulating film 130 and the protective electrode 143 are provided to protect the source electrode 141 from dry etching, so as to ensure the sufficient ohmic characteristics of the source electrode 141. Additionally, the insulating film 130 is provided to cover the edge 141e. Compared with a configuration that the protective electrode 143 is provided to cover over the entire source electrode 141, this configuration suppresses expansion of the semiconductor device size due to the design margin in formation of the gate electrode 142. This configuration thus ensures the sufficient ohmic characteristics of the source electrode 141, while reducing the manufacturing cost and allowing for miniaturization of the semiconductor device.

B. Second Embodiment

Figure 11:
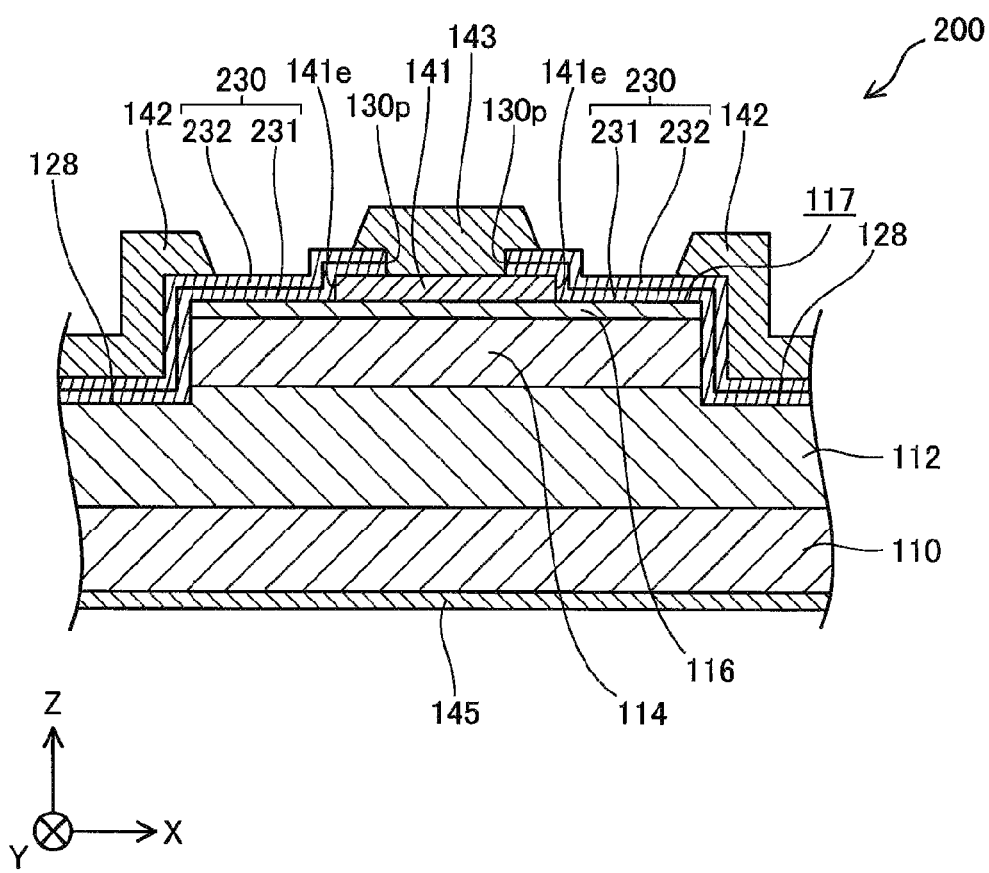
FIG. 11 is a sectional view schematically illustrating the structure of a semiconductor device according to a second embodiment.

FIG. 11 is a sectional view schematically illustrating the structure of a semiconductor device 200 according to a second embodiment. The semiconductor device 200 includes an insulating film 230 that has a multi-layered structure consisting of two insulating layers 231 and 232. The structure of the semiconductor device 200 of the second embodiment is similar to the structure of the semiconductor device 100 of the first embodiment, except that the semiconductor device 200 includes the insulating film 230 having the multi-layered structure. According to another embodiment, the insulating film 230 may have a multi-layered structure consisting of three or a greater number of insulating layers.

The insulating layer 231 of the insulating film 230 is a first insulating layer formed over from the trench 128 through the surface 117 to the source electrode 141. The insulating layer 232 of the insulating film 230 is a second insulating layer formed on the insulating layer 231. According to this embodiment, the insulating layer 232 is formed over the entire area of the insulating layer 231.

According to this embodiment, the component of the insulating layer 231 is different from the component of the insulating layer 232. According to this embodiment, the insulating layer 231 is mainly made of silicon dioxide ($SiO_2$), while the insulating layer 232 is mainly made of zirconium oxynitride ($ZrO_xN_y$ ($0.5 \leq x \leq 3$, $0 \leq y \leq 2$)). According to this embodiment, the component of the insulating layer 232 may be identical with the component of the insulating layer 231.

According to this embodiment, the technique employed to form the insulating layer 231 is different from the technique employed to form the insulating layer 232. According to this embodiment, the technique employed to form the insulating layer 231 is atomic layer deposition (ALD), and the technique employed to form the insulating layer 232 is electron cyclotron resonance (ECR) sputtering.

Like the first embodiment, the second embodiment described above ensures the sufficient ohmic characteristics of the source electrode 141, while reducing the manufacturing cost and allowing for miniaturization of the semiconductor device. Additionally, the characteristics required for the insulating film 230 (for example, interface state, leak current and permittivity) are provided by the combination of the characteristics of the insulating layer 231 with the characteristics of the insulating layer 232.

C. Third Embodiment

C-1. Structure of Semiconductor Device

Figure 12:
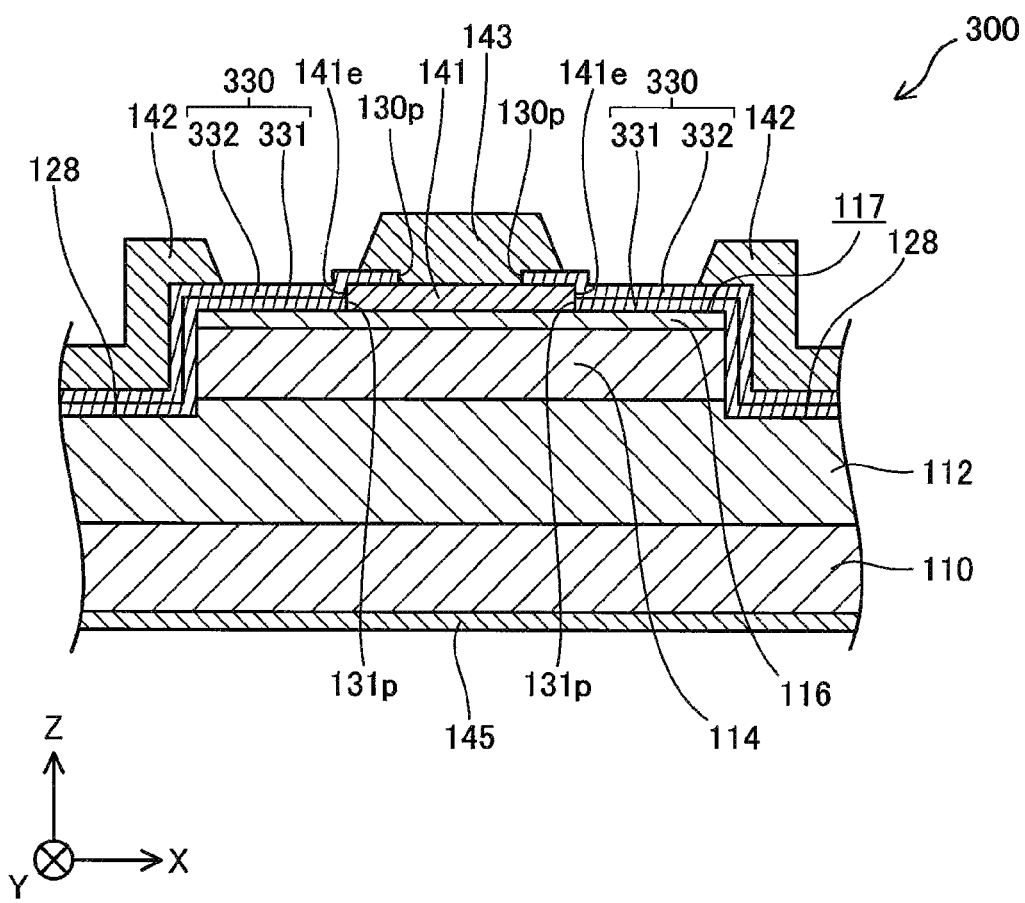
FIG. 12 is a sectional view schematically illustrating the structure of a semiconductor device according to a third embodiment.

FIG. 12 is a sectional view schematically illustrating the structure of a semiconductor device 300 according to a third embodiment. The structure of the semiconductor device 300 of the third embodiment is similar to the structure of the semiconductor device 200 of the second embodiment, except that the semiconductor device 300 includes an insulating film 330 having a multi-layered structure. The insulating film 330 of the semiconductor device 300 has the multi-layered structure consisting of two insulating layers 331 and 332. According to another embodiment, the insulating film 330 may have a multi-layered structure consisting of three or a greater number of insulating layers.

The insulating film 331 of the insulating layer 330 is a first insulating layer formed over from the trench 128 to the edge 141e on the surface 117. The insulating layer 332 of the insulating film 330 is a second insulating layer formed over from the insulating layer 331 to the source electrode 141. The insulating layer 332 has an opening edge 130p located on the inner side of the edge 141e.

According to this embodiment, the component of the insulating layer 331 is different from the component of the insulating layer 332. According to this embodiment, the insulating layer 331 is mainly made of silicon dioxide ($SiO_2$), while the insulating layer 332 is mainly made of zirconium oxynitride ($ZrO_xN_y$ ($0.5 \leq n \leq 3$, $0 \leq y \leq 2$)). According to this embodiment, the component of the insulating layer 332 may be identical with the component of the insulating layer 331.

According to this embodiment, the technique employed to form the insulating layer 331 is different from the technique employed to form the insulating layer 332. According to this embodiment, the technique employed to form the insulating layer 331 is atomic layer deposition (ALD), and the technique employed to form the insulating layer 332 is electron cyclotron resonance (ECR) sputtering.

C-2. Manufacturing Method of Semiconductor Device

Figure 13:
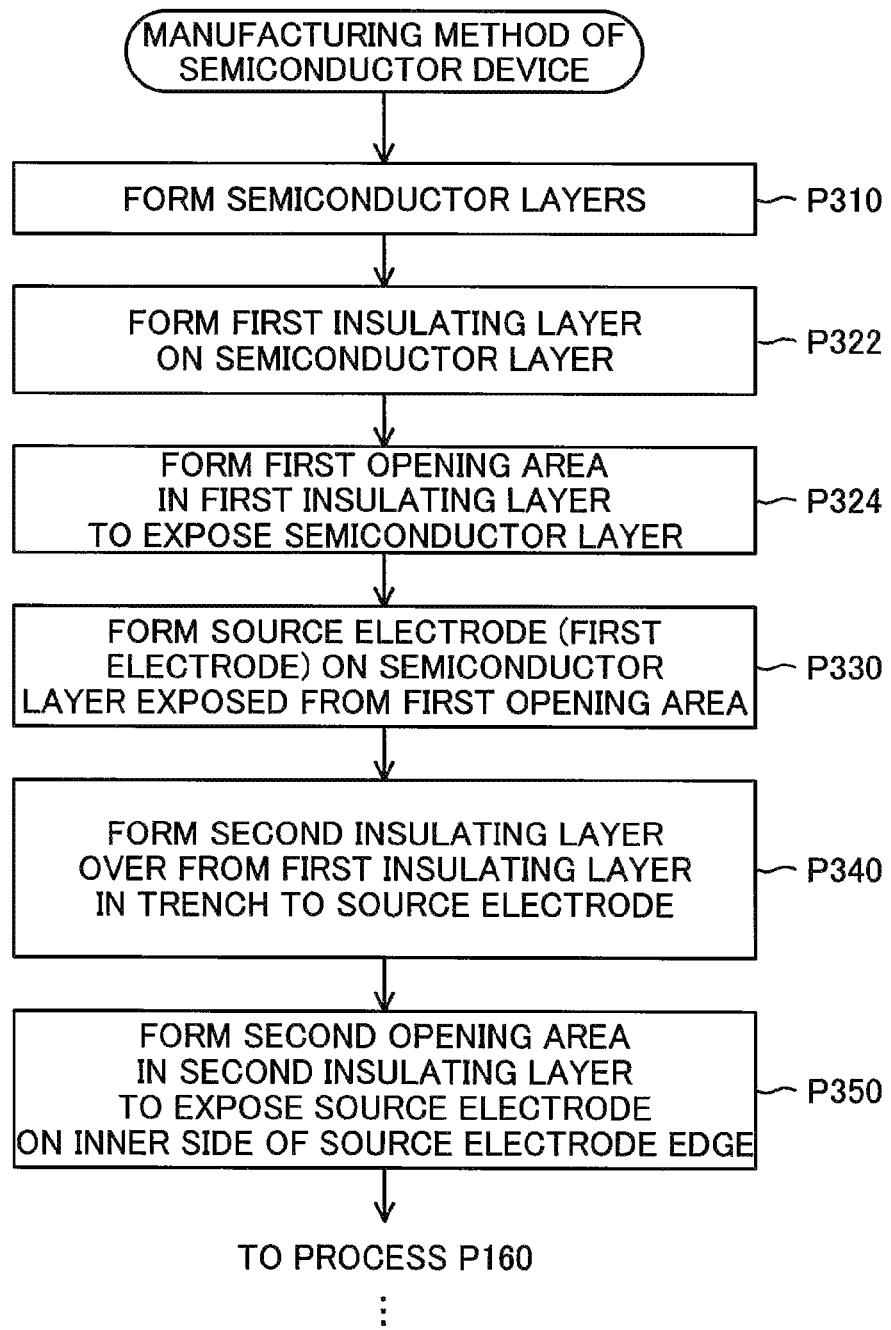
FIG. 13 is a flowchart showing a manufacturing method of the semiconductor device according to the third embodiment.

FIG. 13 is a flowchart showing a manufacturing method of the semiconductor device 300 according to the third embodiment. Like the first embodiment, the manufacturer first forms the semiconductor layers 112, 114 and 116 having the surface 117 and the trench 128 (process P310). The manufacturer accordingly obtains a semiconductor device 100b, in which the trench 128 is formed (as shown in FIG. 5).

After forming the trench 128 in the semiconductor layers 112, 114 and 116 (process P310), the manufacturer forms the insulating layer 331 over from the trench 128 to the surface 117 (process P322). According to this embodiment, the manufacturer employs atomic layer deposition (ALD) to form the insulating layer 331 that is mainly made of silicon dioxide ($SiO_2$).

Figure 14:
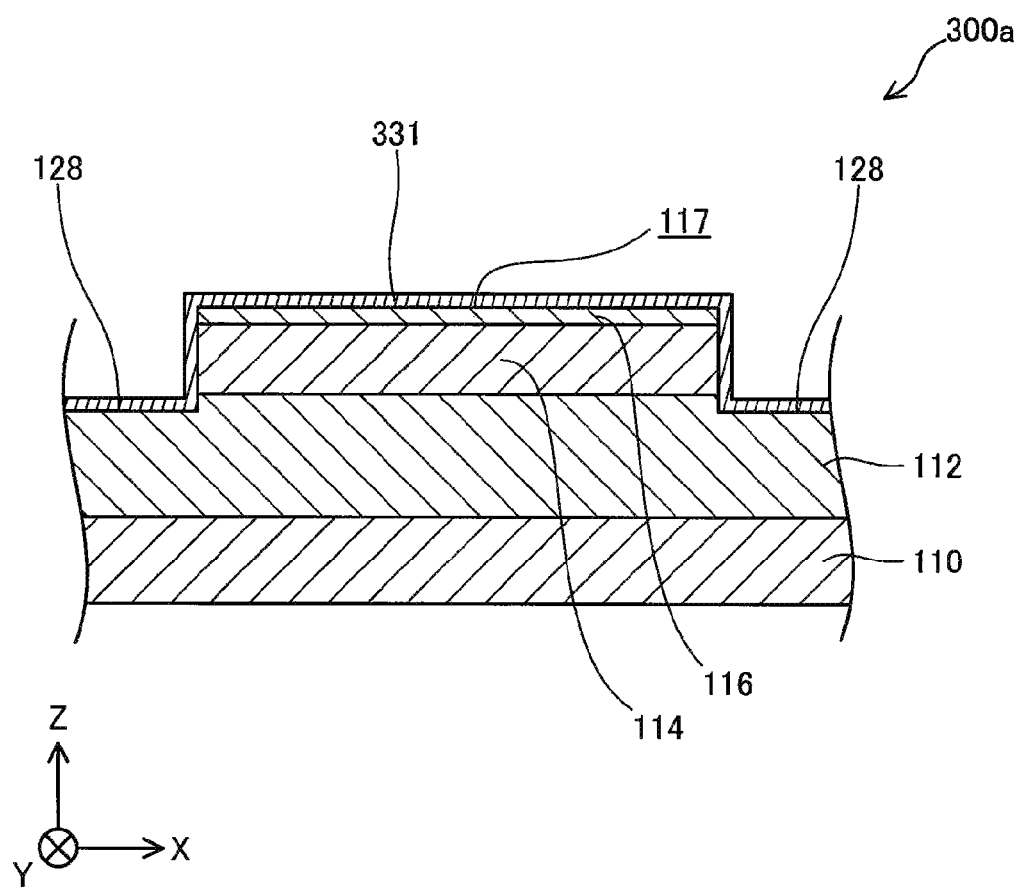
FIG. 14 is a sectional view schematically illustrating the structure of a semiconductor device in the course of manufacture.

FIG. 14 is a sectional view schematically illustrating the structure of a semiconductor device 300a in the course of manufacture at the process P322. According to this embodiment, the manufacturer forms the insulating layer 331 over an entire +Z-axis direction side surface of the semiconductor layer 100b. The manufacturer accordingly obtains the semiconductor device 300a, in which the insulating layer 331 is formed over the entire +Z-axis direction side surface.

Referring back to FIG. 13, after forming the insulating layer 331 (process P322), the manufacturer forms an opening area defined by an opening edge 131p in the insulating layer 331 (process P324). The opening area defined by the opening edge 131p is a first opening from which the surface 117 is exposed.

Figure 15:
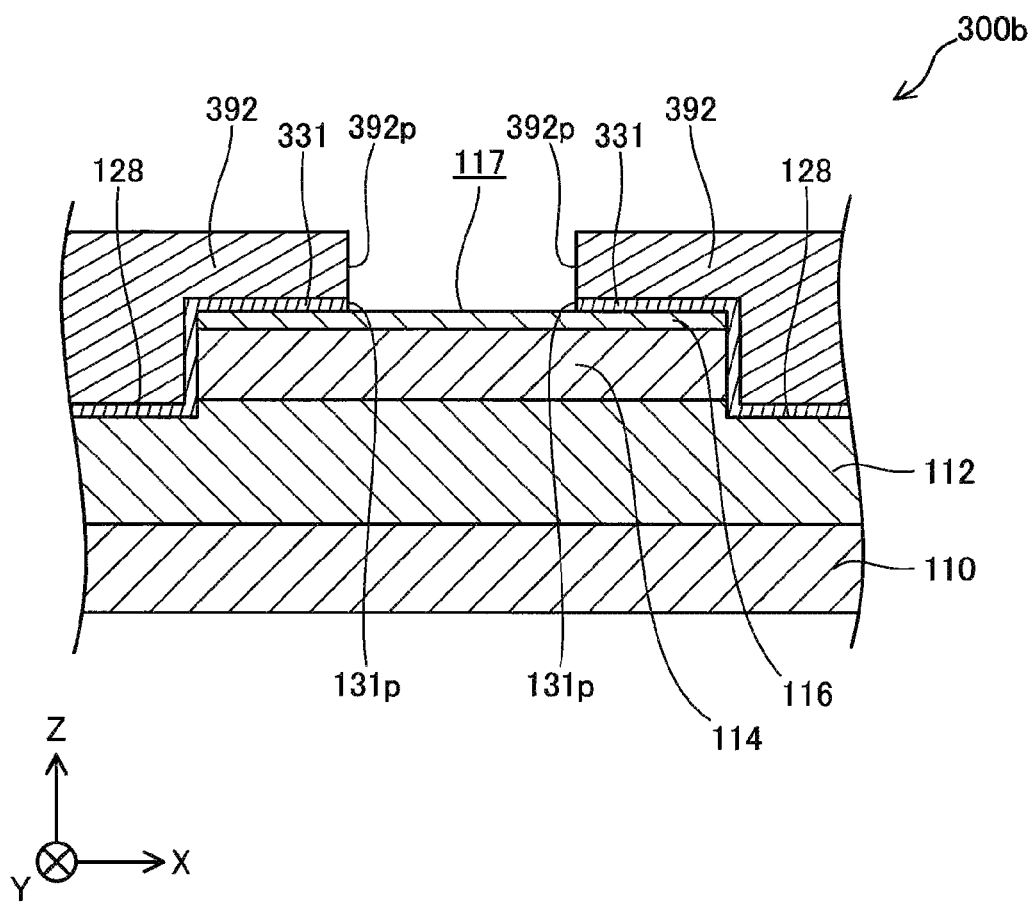
FIG. 15 is a sectional view schematically illustrating the structure of a semiconductor device in the course of manufacture.

FIG. 15 is a sectional view schematically illustrating the structure of a semiconductor device 300b in the course of manufacture at the process P324. According to this embodiment, the manufacturer forms a photoresist mask 392 on the +Z-axis direction side of the semiconductor device 300a. The mask 392 has an opening area defined by an opening edge 392p at a position where the opening area defined by the opening edge 131p is to be formed. After forming the mask 392, the manufacturer removes part of the insulating layer 331 of the semiconductor device 300a by wet etching to expose part of the surface 117 from the insulating layer 331. The manufacturer accordingly obtains a semiconductor device 300b, in which the opening area defined by the opening edge 131p is formed in the insulating layer 331. According to this embodiment, in order to utilize the mask 392, which is used for formation of the opening area defined by the opening edge 131p, as a mask for formation of the source electrode 141, the manufacturer performs a subsequent process in the state that the mask 392 is left in the semiconductor device 300b.

Referring back to FIG. 13, after forming the opening area in the insulating layer 331 (process P324), the manufacturer forms the source electrode 141 on the surface 117, which is exposed from the opening area of the insulating layer 331 (process P330). According to this embodiment, the manufacturer forms the source electrode 141 by stacking a layer made of aluminum (Al) on a layer made of titanium (Ti) and subsequently treating the stacked layers by annealing process (heat treatment).

Figure 16:
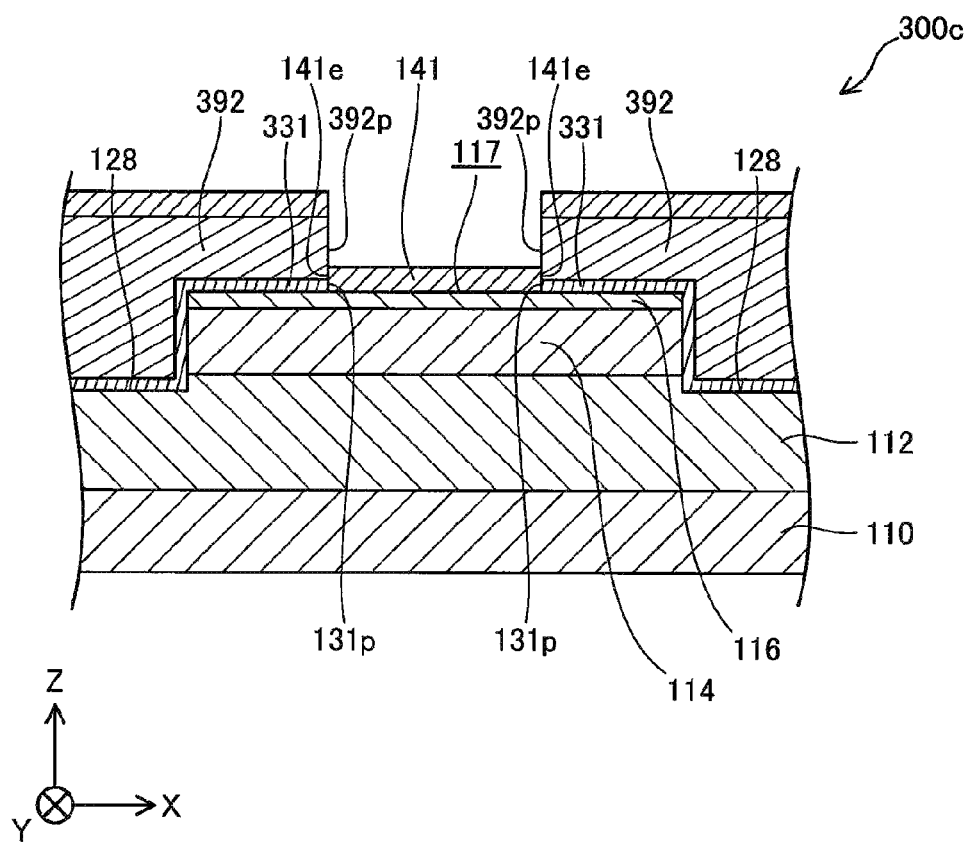
FIG. 16 is a sectional view schematically illustrating the structure of a semiconductor device in the course of manufacture.

FIG. 16 is a sectional view schematically illustrating the structure of a semiconductor device 300c in the course of manufacture at the process P330. According to this embodiment, the manufacturer sequentially deposits titanium (Ti) and aluminum (Al) by vapor deposition on the semiconductor device 300b with the mask 392 left thereon, so as to form the source electrode 141. The manufacturer accordingly obtains the semiconductor device 300c, in which the source electrode 141 is formed on the surface 117. The manufacturer subsequently removes the mask 392 from the semiconductor device 300c and thereby removes the electrode material deposited on the mask 392.

Referring back to FIG. 13, after forming the source electrode 141 (process P330), the manufacturer forms the insulating layer 332 over from the insulating layer 331 in the trench 128 through the insulating layer 331 on the surface 117 to the source electrode 141 (process P340). According to this embodiment, the manufacturer employs electron cyclotron resonance (ECR) sputtering to form the insulating layer 332 mainly made of zirconium oxynitride ($ZrO_xN_y$, ($0.5 \leq x \leq 3$, $0 \leq y \leq 2$)).

Figure 17:
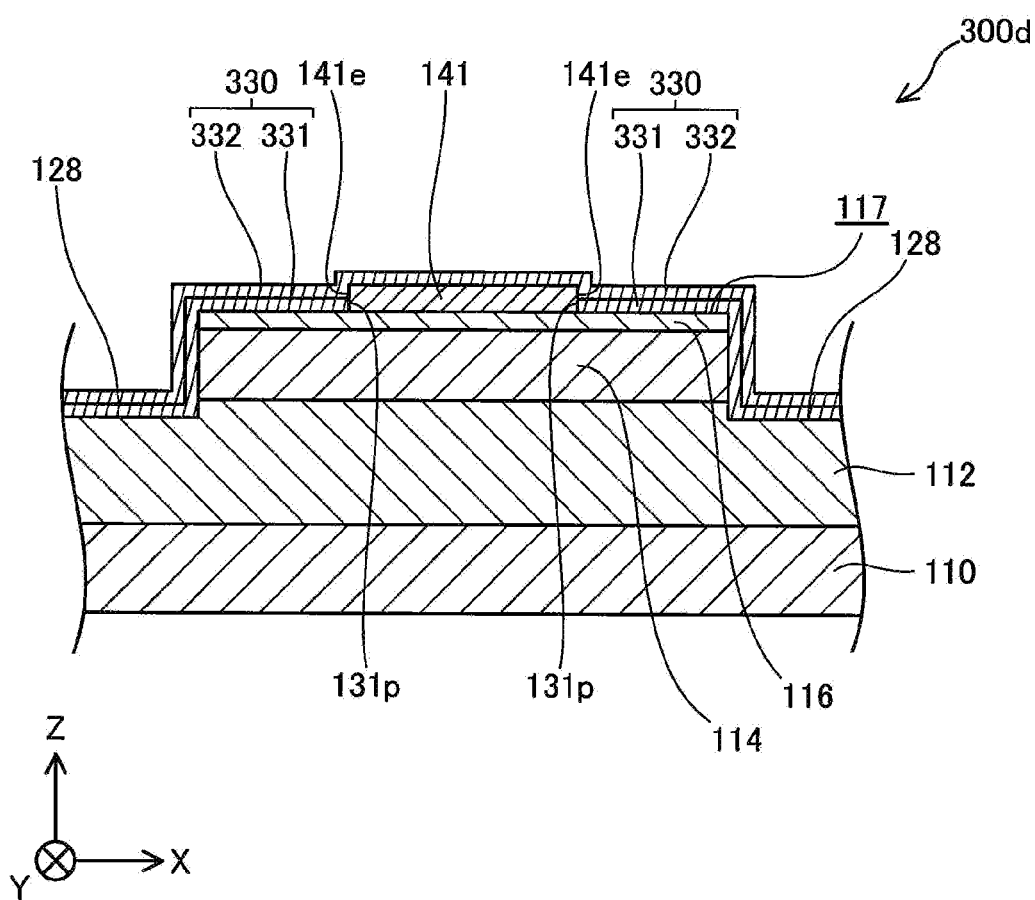
FIG. 17 is a sectional view schematically illustrating the structure of a semiconductor device in the course of manufacture.

FIG. 17 is a sectional view schematically illustrating the structure of a semiconductor device 300d in the course of manufacture at the process P340. According to this embodiment, the manufacturer forms the insulating layer 332 over an entire +Z-axis direction side surface of the semiconductor device 300c after removal of the mask 392. The manufacturer accordingly obtains the semiconductor device 300d, in which the insulating layer 332 is formed over the +Z-axis direction side surface.

Referring back to FIG. 13, after forming the insulating layer 332 (process P340), the manufacturer forms an opening area defined by the opening edge 130p in the insulating layer 332 (process P350). According to this embodiment, the opening area defined by the opening edge 130p is a second opening to expose the source electrode 141 on the inner side of the edge 141e.

Figure 18:
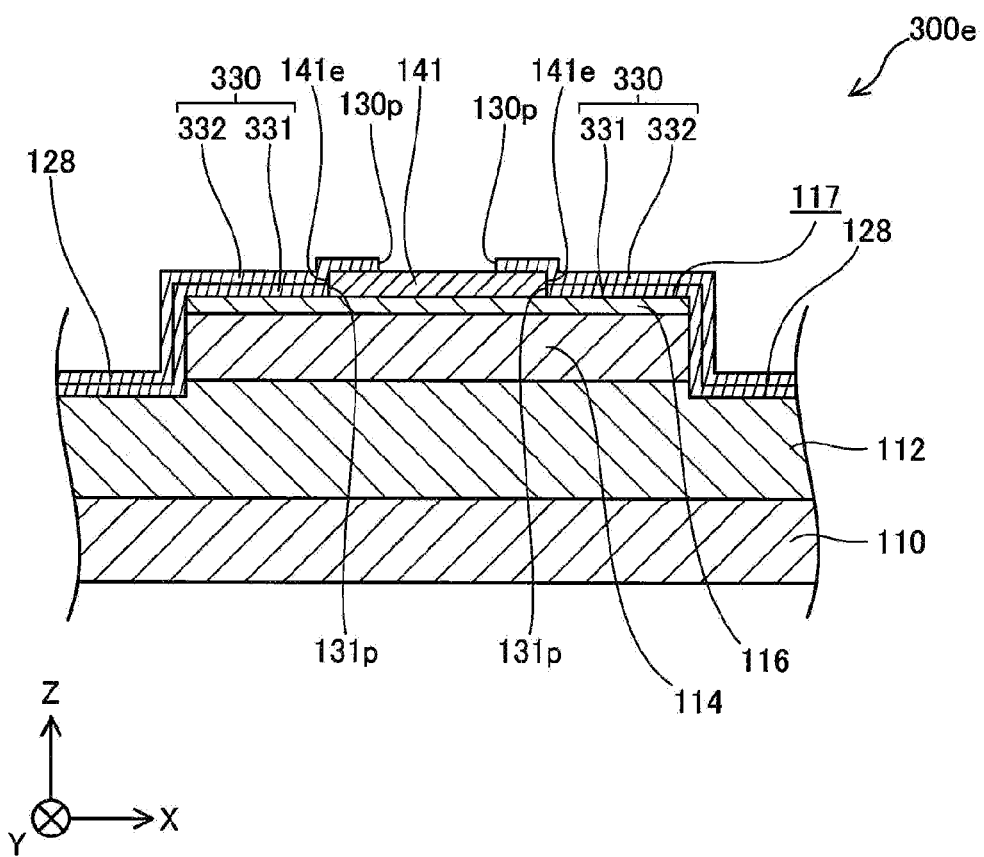
FIG. 18 is a sectional view schematically illustrating the structure of a semiconductor device in the course of manufacture.

FIG. 18 is a sectional view schematically illustrating the structure of a semiconductor device 300e in the course of manufacture at the process P350. According to this embodiment, the manufacturer removes part of the insulating layer 332 in the semiconductor device 300d by wet etching, so as to make the source electrode 141 exposed from the insulating layer 332 on the inner side of the edge 141e. The manufacturer accordingly obtains the semiconductor device 300e, in which the opening area defined by the opening edge 130p is formed in the insulating layer 332. The opening area defined by the opening edge 130p exposes the source electrode 141 on the inner side of the edge 141e.

Referring back to FIG. 13, after forming the opening edge 130p (process P350), the manufacturer performs the process P160 to form the electrode layer 148 and the subsequent series of processes. The semiconductor device 300 is completed through the above series of processes.

C-3. Advantageous Effects

Like the first embodiment, the third embodiment described above ensures the sufficient ohmic characteristics of the source electrode 141, while reducing the manufacturing cost and allowing for miniaturization of the semiconductor device. Like the second embodiment, the third embodiment described above also provides the characteristics required for the insulating film 330 by combining the characteristics of the insulating layer 331 with the characteristics of the insulating layer 332. In the third embodiment, the insulating layer 331 protects the surface of the semiconductor layer 114 in the trench 128 from contamination in the process of forming the source electrode 141 (process P330). This suppresses the interfacial characteristics from being deteriorated with an increase in interface state density between the semiconductor layer 114 in the trench 128 and the insulating film 330. Additionally, the source electrode 141 is formed by self-alignment. This suppresses expansion of the semiconductor device size due to the design margin. The self-alignment eliminates the need to separately provide a mask for formation of the source electrode 141, thus reducing the manufacturing cost.

D. Fourth Embodiment

D-1. Structure of Semiconductor Device

Figure 19:
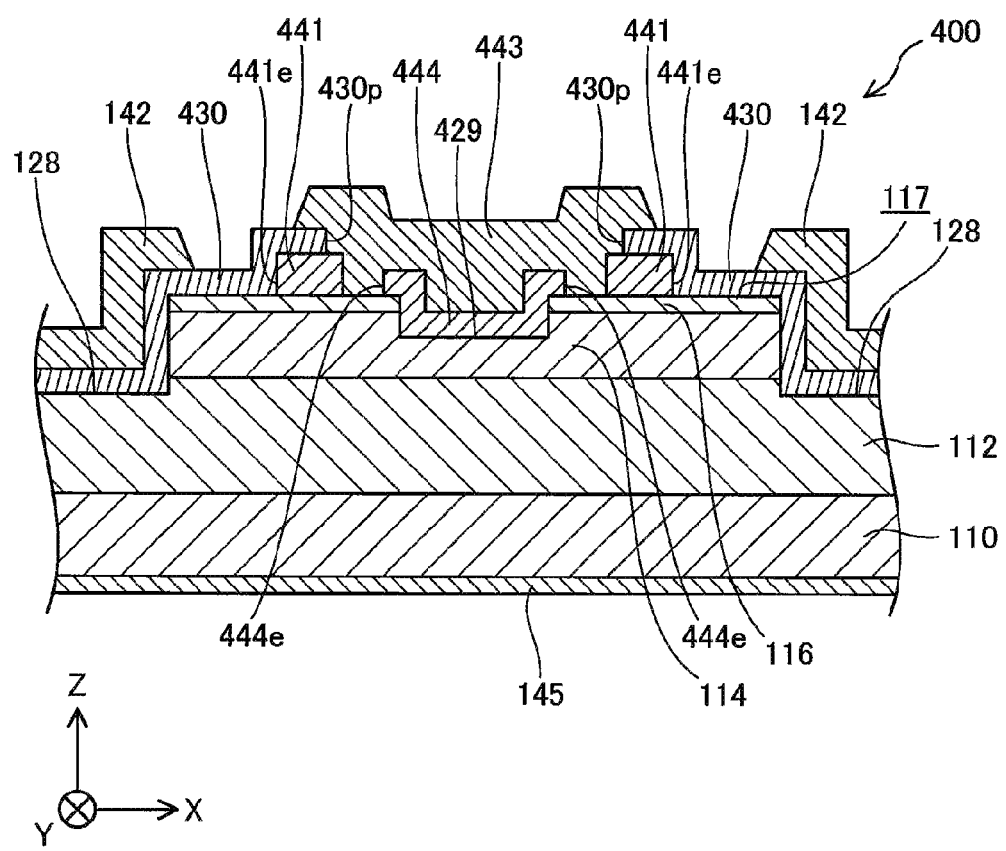
FIG. 19 is a sectional view schematically illustrating the structure of a semiconductor device according to a fourth embodiment.

FIG. 19 is a sectional view schematically illustrating the structure of a semiconductor device 400 according to a fourth embodiment. The structure of the semiconductor device 400 of the fourth embodiment is similar to the structure of the semiconductor device 100 of the first embodiment, except differences in structure involved in formation of a body electrode 444. The semiconductor device 400 includes a recess 429, a body electrode 444, an insulating film 430, a source electrode 441 and a protective electrode 443 as different structures from those of the semiconductor device 100.

The recess 429 of the semiconductor device 400 is a concave recessed from the surface 117 to pass through the semiconductor layer 116 and enter the semiconductor layer 114. According to this embodiment, the recess 429 is a structure formed by dry etching of the semiconductor layers 114 and 116.

The body electrode 444 of the semiconductor device 400 is a fourth electrode formed in the recess 429. According to this embodiment, the body electrode 444 is formed over from inside of the recess 429 to the surface 117. The body electrode 444 is in ohmic contact with the semiconductor layer 114 that is adjacent to the semiconductor layer 116. According to this embodiment, the body electrode 444 is an electrode formed by stacking a layer made of palladium (Pd) and subsequently treating the layer by annealing process (heat treatment).

The source electrode 441 of the semiconductor device 400 is similar to the source electrode 141 of the first embodiment, except that the source electrode 441 is formed on the outer side of an edge 444e of the body electrode 444. The source electrode 441 has an edge 441e covered by the insulating film 430.

The insulating film 430 of the semiconductor device 400 is a film formed similarly to the insulating film 130 of the first embodiment. The insulating film 430 is formed over from the trench 128 through the surface 117 of the semiconductor layer 116 to the source electrode 441. The insulating film 430 has an opening edge 430p on the inner side of the edge 441e.

The protective electrode 443 of the semiconductor device 400 is a third electrode formed similarly to the protective electrode 143 of the first embodiment. The protective electrode 443 is formed on the source electrode 441 through an opening area defined by the opening edge 430p of the insulating film 430 and is formed over from the source electrode 441 to the inner side of the edge 441e on the insulating film 430.

D-2. Manufacturing Method of Semiconductor Device

Figure 20:
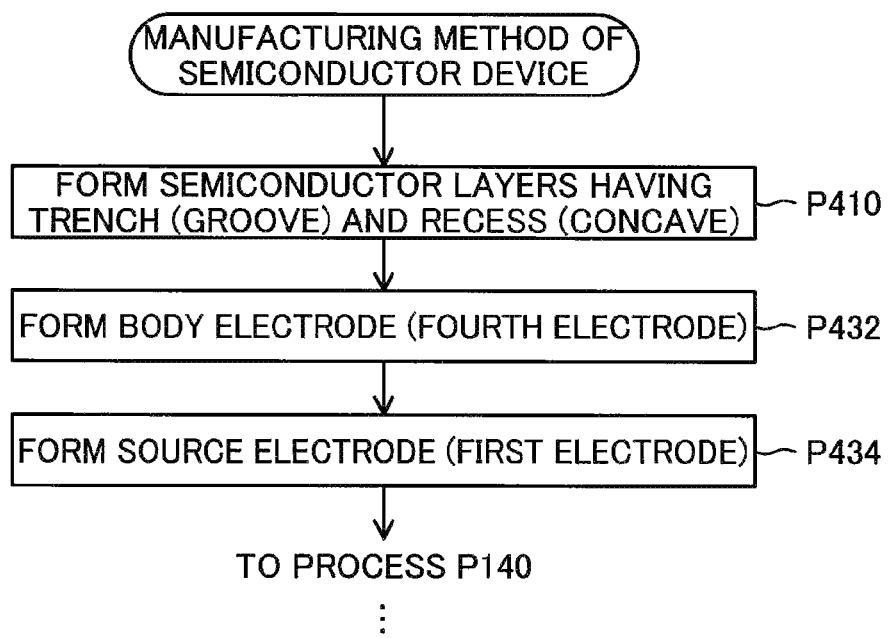
FIG. 20 is a flowchart showing a manufacturing method of the semiconductor device according to the fourth embodiment.

FIG. 20 is a flowchart showing a manufacturing method of the semiconductor device 400 according to the fourth embodiment. The manufacturer sequentially forms the semiconductor layers 112, 114 and 116 on the substrate 110 by MOCVD and subsequently forms the trench 128 and the recess 429 by dry etching (process P410).

After forming the trench 128 and the recess 429 (process P410), the manufacturer forms the body electrode 444 in the recess 429 (process P432). According to this embodiment, the manufacturer forms the body electrode 444 by stacking a layer made of palladium (Pd) and subsequently treating the layer by annealing process (heat treatment).

After forming the body electrode 444 (process P432), the manufacturer forms the source electrode 441 on the surface 117 of the semiconductor layer 116 (process P434). The technique employed to form the source electrode 441 is similar to the technique employed in the first embodiment, except that the source electrode 441 is formed on the outer side of the body electrode 444. According to another embodiment, the body electrode 444 may be formed after formation of the source electrode 441.

After forming the source electrode 441 (process P434), the manufacturer performs the process P140 to form an insulating film and the subsequent series of processes in conformity with the manufacturing method of the first embodiment, so as to form the gate electrode 142, the protective electrode 443 and the drain electrode 145. The semiconductor device 400 is completed through the above series of processes.

D-3. Advantageous Effects

Like the first embodiment, the fourth embodiment described above ensures the sufficient ohmic characteristics of the source electrode 441, while reducing the manufacturing cost and allowing for miniaturization of the semiconductor device. Additionally, the body electrode 444 forms a body diode.

E. Fifth Embodiment

Figure 21:
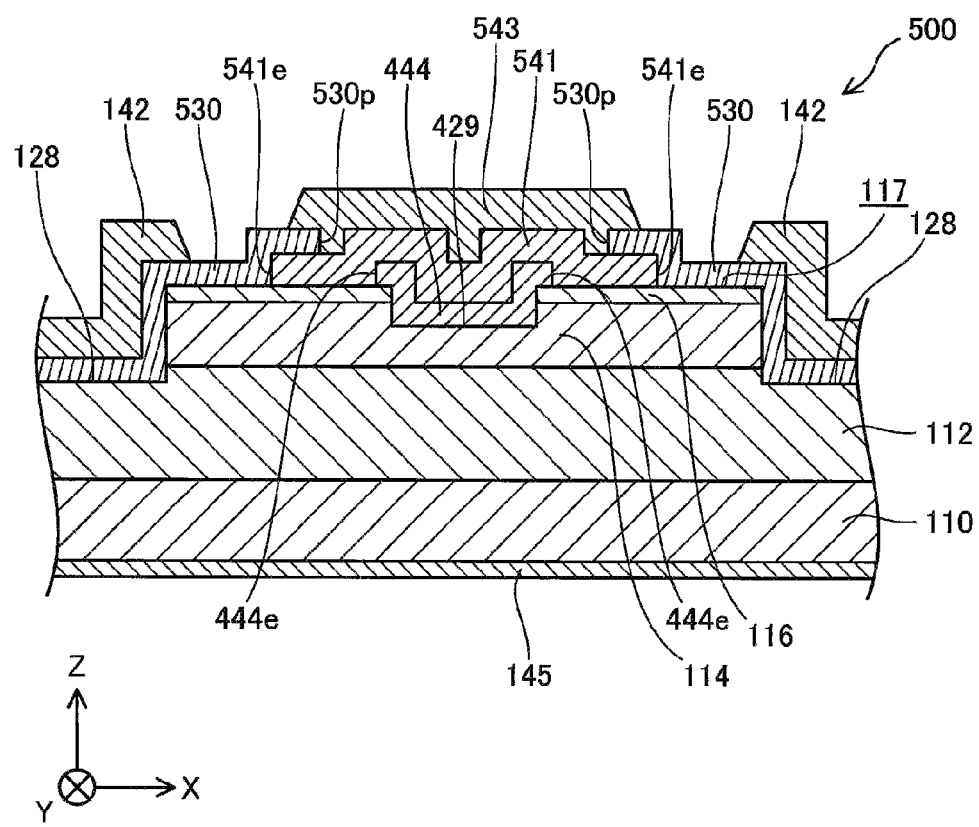
FIG. 21 is a sectional view schematically illustrating the structure of a semiconductor device according to a fifth embodiment.

FIG. 21 is a sectional view schematically illustrating the structure of a semiconductor device 500 according to a fifth embodiment. The structure of the semiconductor device 500 of the fifth embodiment is similar to the structure of the semiconductor device 100 of the first embodiment, except differences in structure involved in formation of a body electrode 444. The semiconductor device 500 includes a recess 429, a body electrode 444, an insulating film 530, a source electrode 541 and a protective electrode 543 as different structures from those of the semiconductor device 100. The recess 429 and the body electrode 444 of the semiconductor device 500 are identical with those of the fourth embodiment.

The source electrode 541 of the semiconductor device 500 is similar to the source electrode 141 of the first embodiment, except that the source electrode 541 is formed over from the surface 117 of the semiconductor layer 116 to the body electrode 444. The source electrode 541 has an edge 541e covered by the insulating film 530.

The insulating film 530 of the semiconductor device 500 is a film formed similarly to the insulating film 130 of the first embodiment. The insulating film 530 is formed over from the trench 128 through the surface 117 of the semiconductor layer 116 to the source electrode 541. The insulating film 530 has an opening edge 530p on the inner side of the edge 541e. The opening edge 530p of the insulating film 530 is located on the outer side of the edge 444e.

The protective electrode 543 of the semiconductor device 500 is a third electrode formed similarly to the protective electrode 143 of the first embodiment. The protective electrode 543 is formed on the source electrode 541 through an opening area defined by the opening edge 530p of the insulating film 530 and is formed over from the source electrode 541 to the inner side of the edge 541e on the insulating film 530.

Like the first embodiment, the fifth embodiment described above ensures the sufficient ohmic characteristics of the source electrode 541, while reducing the manufacturing cost and allowing for miniaturization of the semiconductor device. The source electrode 541 is formed over from the surface 117 to the body electrode 444. This suppresses expansion of the semiconductor device size due to the design margin in formation of the body electrode 444. Additionally, the body electrode 444 forms a body diode.

F. Sixth Embodiment

Figure 22:
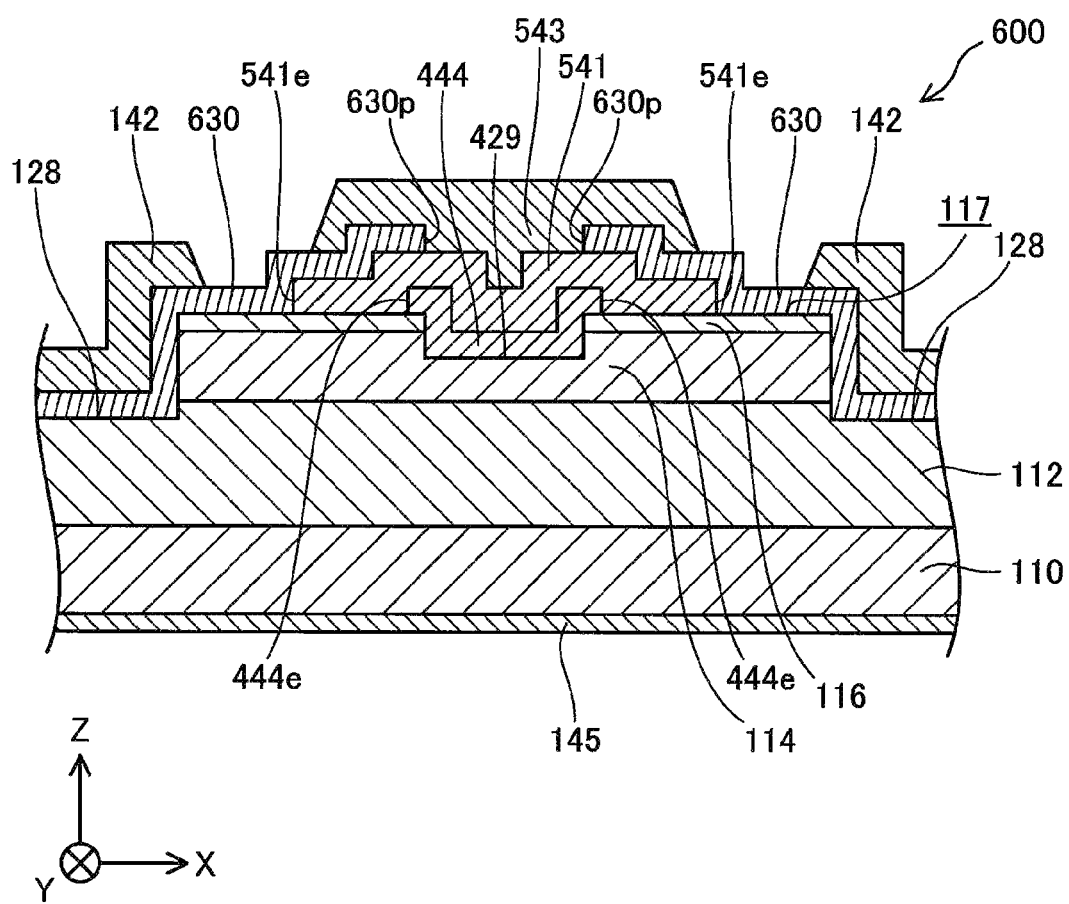
FIG. 22 is a sectional view schematically illustrating the structure of a semiconductor device according to a sixth embodiment.

FIG. 22 is a sectional view schematically illustrating the structure of a semiconductor device 600 according to a sixth embodiment. The structure of the semiconductor device 600 of the sixth embodiment is similar to the structure of the semiconductor device 500 of the fifth embodiment, except that the semiconductor device 600 includes an insulating film 630. The insulating film 630 of the semiconductor device 600 is similar to the insulating film 530 of the fifth embodiment, except that the insulating film 630 has an opening edge 630p that is located on the inner side of the edge 444e.

Like the first embodiment, the sixth embodiment described above ensures the sufficient ohmic characteristics of the source electrode 541, while reducing the manufacturing cost and allowing for miniaturization of the semiconductor device. The body electrode 444 forms a body diode. The source electrode 541 is formed over from the surface 117 to the body electrode 444. This suppresses expansion of the semiconductor device size due to the design margin in formation of the body electrode 444. Additionally, the opening edge 630p of the insulating film 630 is located on the inner side of the edge 444e. This configuration enables a portion of the source electrode 541 that is in contact with the surface 117 to be protected from the process of forming an opening defined by the opening edge 630p in the insulating film 630. This further reduces the contact resistance of the source electrode 541.

G. Seventh Embodiment

G-1. Structure of Semiconductor Device

Figure 23:
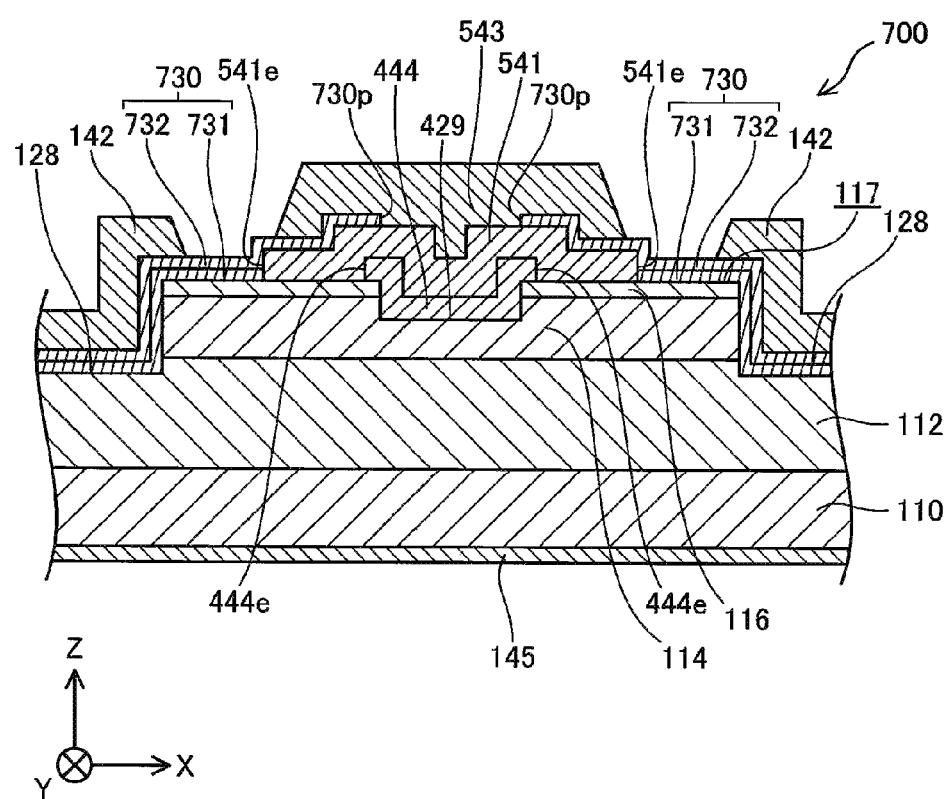
FIG. 23 is a sectional view schematically illustrating the structure of a semiconductor device according to a seventh embodiment.

FIG. 23 is a sectional view schematically illustrating the structure of a semiconductor device 700 according to a seventh embodiment. The structure of the semiconductor device 700 of the seventh embodiment is similar to the structure of the semiconductor device 500 of the fifth embodiment, except that the semiconductor device 700 includes an insulating film 730. The insulating film 730 of the semiconductor device 700 has a multi-layered structure consisting of two insulating layers 731 and 732. According to another embodiment, the insulating film 730 may have a multi-layered structure consisting of three or a greater number of insulating layers.

The insulating layer 731 of the insulating film 730 is a first insulating layer formed over the trench 128 to the edge 541e on the surface 117. The insulating layer 732 of the insulating film 730 is a second insulating layer formed over from the insulating layer 731 to the source electrode 541. The insulating layer 732 has an opening edge 730p that is located on the inner side of the edge 541e. The opening edge 730p of the insulating layer 732 is also located on the inner side of the edge 444e.

According to this embodiment, the component of the insulating layer 731 is different from the component of the insulating layer 732. According to this embodiment, the insulating layer 731 is mainly made of silicon dioxide ($SiO_2$), while the insulating layer 732 is mainly made of zirconium oxynitride ($ZrO_xN_y$ ($0.5 \leq x \leq 3$, $0 \leq y \leq 2$)). According to this embodiment, the component of the insulating layer 732 may be identical with the component of the insulating layer 731.

According to this embodiment, the technique employed to form the insulating layer 731 is different from the technique employed to form the insulating layer 732. According to this embodiment, the technique employed to form the insulating layer 731 is atomic layer deposition (ALD), and the technique employed to form the insulating layer 732 is electron cyclotron resonance (ECR) sputtering.

G-2. Manufacturing Method of Semiconductor Device

Figure 24:
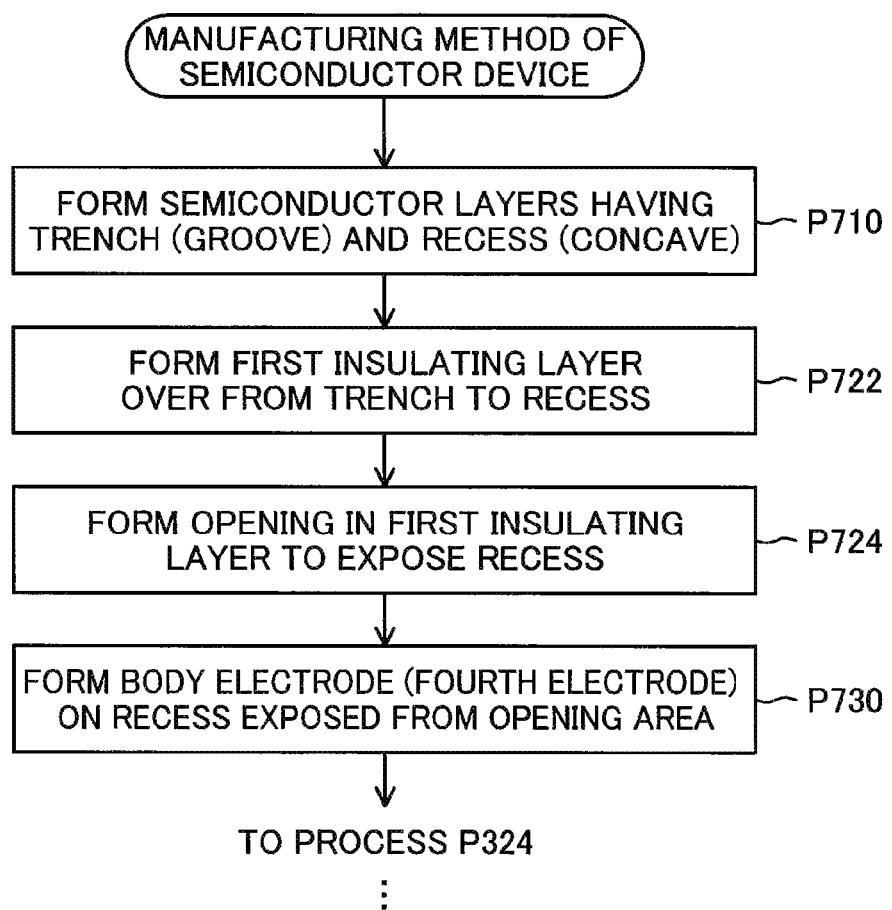
FIG. 24 is a flowchart showing a manufacturing method of the semiconductor device according to the seventh embodiment.

FIG. 24 is a flowchart showing a manufacturing method of the semiconductor device 700 according to the seventh embodiment. The manufacturer sequentially forms the semiconductor layers 112, 114 and 116 on the substrate 110 by MOCVD and subsequently forms the trench 128 and the recess 429 by dry etching (process P710).

After forming the trench 128 and the recess 429 (process P710), the manufacturer forms the insulating layer 731 over from the trench 128 through the surface 117 to the recess 429 (process P722). According to this embodiment, the manufacturer employs atomic layer deposition (ALD) to form the insulating layer 731 that is mainly made of silicon dioxide ($SiO_2$).

After forming the insulating layer 731 (process P722), the manufacturer forms an opening area in the insulating layer 731 to expose part of the surface 117 and the recess 429 (process P724). According to this embodiment, the manufacturer forms the opening area in the insulating layer 731 to expose the recess 429 by wet etching.

After forming the opening area to expose the recess 429 (process P724), the manufacturer forms the body electrode 444 on the surface 117 exposed from the opening area (process P730). According to this embodiment, the manufacturer forms the body electrode 444 by stacking a layer made of palladium (Pd) and subsequently treating the layer by annealing process (heat treatment).

After forming the body electrode 444 (process P730), the manufacturer performs the process P324 to form an opening area and the subsequent series of processes in conformity with the manufacturing method of the third embodiment, so as to form the source electrode 541, the insulating layer 732, the gate electrode 142, the protective electrode 543 and the drain electrode 145. The semiconductor device 700 is completed through the above series of processes.

G-3. Advantageous Effects

Like the first embodiment, the seventh embodiment described above ensures the sufficient ohmic characteristics of the source electrode 541, while reducing the manufacturing cost and allowing for miniaturization of the semiconductor device. Like the second embodiment, the seventh embodiment described above also provides the characteristics required for the insulating film 730 by combining the characteristics of the insulating layer 731 with the characteristics of the insulating layer 732. In the seventh embodiment, the insulating layer 731 protects the surface of the semiconductor layer 114 in the trench 128 from contamination in the process of forming the source electrode 541 (process P330). This suppresses the interfacial characteristics from being deteriorated with an increase in interface state density between the semiconductor layer 114 in the trench 128 and the insulating film 730. Additionally, the source electrode 541 is formed by self-alignment. This suppresses expansion of the semiconductor device size due to the design margin. The self-alignment eliminates the need to separately provide a mask for formation of the source electrode 541, thus reducing the manufacturing cost.

The body electrode 444 forms a body diode. The source electrode 541 is formed over from the surface 117 to the body electrode 444. This suppresses expansion of the semiconductor device size due to the design margin in formation of the body electrode 444. Additionally, the opening edge 730p of the insulating film 730 is located on the inner side of the edge 444e. This configuration enables a portion of the source electrode 541 that is in contact with the surface 117 to be protected from the process of forming an opening area defined by the opening edge 730p in the insulating film 730. This further reduces the contact resistance of the source electrode 541.

H. Eighth Embodiment

Figure 25:
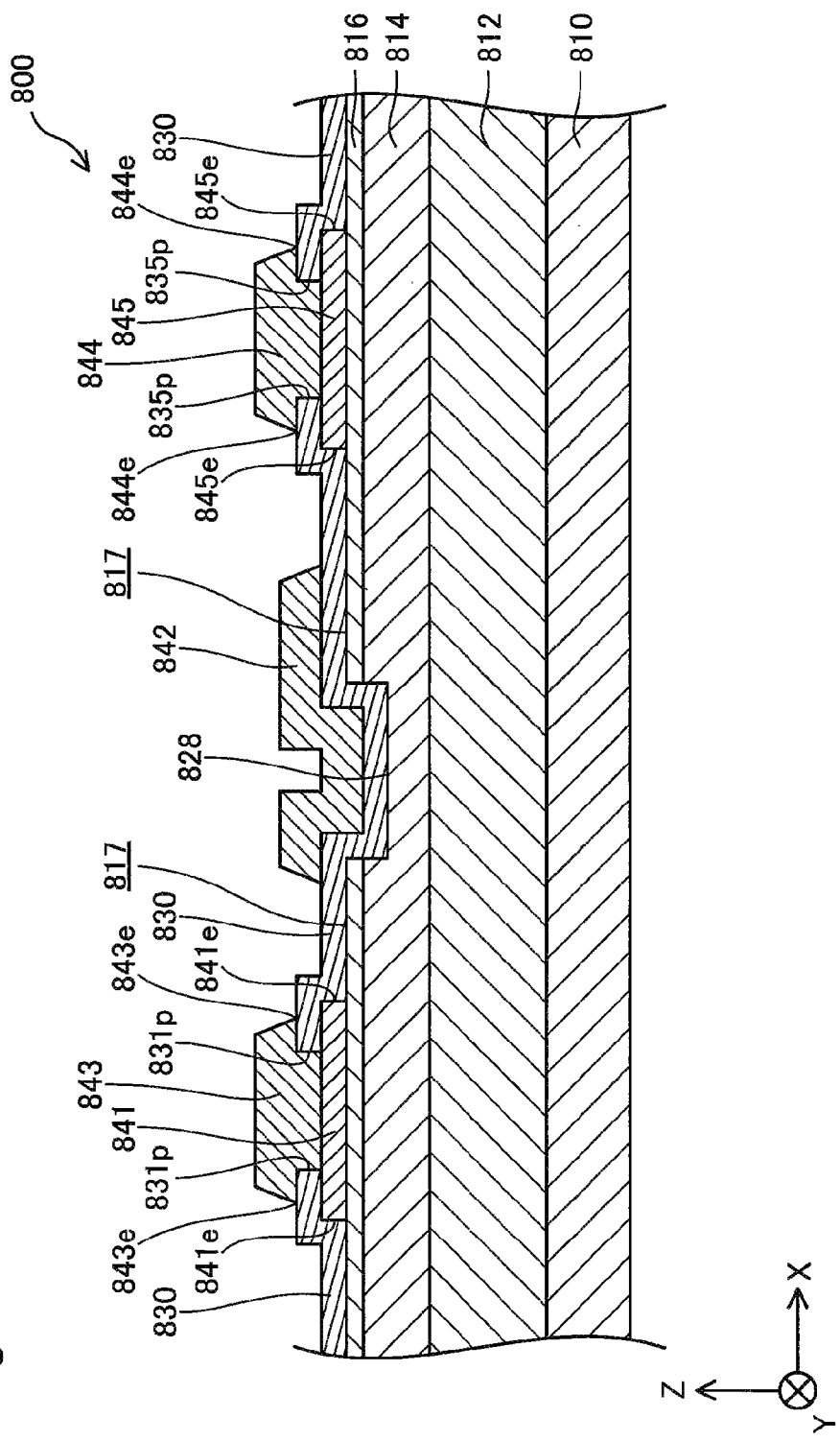
FIG. 25 is a sectional view schematically illustrating the structure of a semiconductor device according to an eighth embodiment.

FIG. 25 is a sectional view schematically illustrating the structure of a semiconductor device 800 according to an eighth embodiment. XYZ axes similar to those of FIG. 1 are shown in FIG. 25. The semiconductor device 800 is a GaN-based semiconductor device. According to this embodiment, the semiconductor device 800 is a lateral MISFET (metal-insulator-semiconductor field-effect transistor) having a recessed structure.

The semiconductor device 800 includes a substrate 810, a semiconductor layer 812, a semiconductor layer 814 and a semiconductor layer 816. The semiconductor device 800 has a recess 828 as a structure formed in these semiconductor layers 812, 814 and 816. The semiconductor device 800 further includes an insulating film 830, a source electrode 841, a gate electrode 842, protective electrodes 843 and 844 and a drain electrode 845.

The substrate 810 of the semiconductor device 800 is a semiconductor formed in a plate-like shape extended along both the X axis and the Y axis. According to this embodiment, the substrate 810 is mainly made of silicon (Si).

The semiconductor layer 812 of the semiconductor device 800 is a buffer layer located on the +Z-axis direction side of the substrate 810 and extended along the X axis and the Y axis. According to this embodiment, the semiconductor layer 812 has a multi-layered structure of a relatively thick undoped layer mainly made of gallium nitride (GaN) stacked on a relatively thin undoped layer mainly made of aluminum nitride (AlN). According to this embodiment, the semiconductor layer 812 is a layer formed on the substrate 810 by MOCVD.

The semiconductor layer 814 of the semiconductor device 800 is a carrier transit layer located on the +Z-axis direction side of the semiconductor layer 812 and extended along the X axis and the Y axis. According to this embodiment, the semiconductor layer 814 is an undoped layer mainly made of gallium nitride (GaN). According to this embodiment, the semiconductor layer 814 is a layer formed on the semiconductor layer 812 by MOCVD.

The semiconductor layer 816 of the semiconductor device 800 is a barrier layer located on the +Z-axis direction side of the semiconductor layer 814 and extended along the X axis and the Y axis. The semiconductor layer 816 has a surface 817 that is adjacent to the recess 828. According to this embodiment, the surface 817 faces in the +Z-axis direction. According to this embodiment, the semiconductor layer 816 is an undoped layer mainly made of aluminum gallium nitride ($Al_{0.25}Ga_{0.75}N$). The semiconductor layer 816 has a wider band gap than the semiconductor layer 814 that is the carrier transit layer and serves to supply the carrier to the semiconductor layer 814. At a heterojunction interface between the semiconductor layer 814 and the semiconductor layer 816, a two-dimensional electron gas is generated on the semiconductor layer 814-side by the effect of positive polarization charge. According to this embodiment, the semiconductor layer 816 is a layer formed on the semiconductor layer 814 by MOCVD.

The material of the semiconductor layer 816 is not limited to aluminum gallium nitride (AlGaN) but may be another nitride such as aluminum indium nitride (AlInN) or aluminum indium gallium nitride (AlGaInN). The semiconductor layer 816 is not limited to the undoped layer but may be a doped layer. The semiconductor layer 816 is not limited to the single layered-structure but may be formed as a multi-layered semiconductor layer consisting of a plurality of semiconductor layers having difference in at least one of the material and the doping concentration. The semiconductor layer 816 may have a multi-layered structure of, for example, GaN/AlGaN, InGaN/AlGaN, InGaN/AlGaN/AlN. According to another embodiment, a structure comprised of another barrier layer and another carrier transit layer may be formed on the semiconductor layer 814 and the semiconductor layer 816.

The recess 828 of the semiconductor device 800 is a concave recessed to pass through the semiconductor layer 816 and enter the semiconductor layer 814. According to this embodiment, the recess 8282 is a structure formed by dry etching of the semiconductor layers 814 and 816. The recess 828 has a depth set such as to sufficiently separate a two-dimensional electron gas between the source electrode 841 and the gate electrode 842 from a two-dimensional electron gas between the gate electrode 842 and the drain electrode 845 in the state that no gate voltage is applied to the gate electrode 842. This achieves normally-off operation that suppresses the flow of electric current between the source electrode 841 and the drain electrode 845 in the state that no gate voltage is applied to the gate electrode 842.

The insulating film 830 of the semiconductor device 800 is a film having electrical insulating characteristics. The insulating film 830 is formed over the surface 817 and formed over from the recess 828 to the source electrode 841 and the drain electrode 845. The insulating film 830 has an opening edge 831p located on the inner side of an edge 841e of the source electrode 841. The insulating film 830 has also an opening edge 835p located on the inner side of an edge 845e of the drain electrode 845. According to this embodiment, the insulating film 830 is mainly made of silicon dioxide ($SiO_2$). According to this embodiment, the insulating film 830 is a film formed similarly to the insulating film 130 of the first embodiment.

The source electrode 841 of the semiconductor device 800 is a first electrode that is in ohmic contact with part of the surface 817 of the semiconductor layer 816. The edge 841e is covered by the insulating film 830. According to this embodiment, the source electrode 841 is an electrode formed similarly to the source electrode 141 of the first embodiment.

The gate electrode 842 of the semiconductor device 800 is a second electrode that is continuously formed via the insulating film 830 over from the recess 828 to the surface 817 in its periphery. According to this embodiment, the gate electrode 842 is an electrode formed similarly to the gate electrode 142 of the first embodiment.

The drain electrode 845 of the semiconductor device 800 is a first electrode that is in ohmic contact with specific part of the surface 817 of the semiconductor layer 816, which is more distant from the source electrode 841 than the gate electrode 842. The edge 845e is covered by the insulating film 830. According to this embodiment, the drain electrode 845 is an electrode formed similarly to the source electrode 841.

The protective electrode 843 of the semiconductor device 800 is a third electrode formed on the source electrode 841 through an opening area defined by the opening edge 831p of the insulating film 830 and formed over from the source electrode 841 to the inner side of the edge 841e on the insulating film 830. The protective electrode 843 has an edge 843e that is located between the opening edge 831p of the insulating film 830 and the edge 841e. The protective electrode 843 is made of a component identical with the component of the gate electrode 842. The protective electrode 843 is an electrode formed similarly to the protective electrode 143 of the first embodiment.

The protective electrode 844 of the semiconductor device 800 is a third electrode formed on the drain electrode 845 through an opening area defined by the opening edge 835p of the insulating film 830 and formed over from the drain electrode 845 to the inner side of the edge 845e on the insulating film 830. The protective electrode 844 has an edge 844e that is located between the opening edge 835p of the insulating film 830 and the edge 845e. The protective electrode 844 is made of a component identical with the component of the gate electrode 842. The protective electrode 844 is an electrode formed similarly to the protective electrode 843.

Like the first embodiment, in the eighth embodiment described above, the insulating film 830 and the protective electrode 843 are provided to protect the source electrode 841 from dry etching, so as to ensure the sufficient ohmic characteristics of the source electrode 841. Similarly the insulating film 830 and the protective electrode 844 are provided to protect the drain electrode 845 from dry etching, so as to ensure the sufficient ohmic characteristics of the drain electrode 845. The insulating film 830 is provided to cover the edge 841e and the edge 845e. Compared with a configuration that the protective electrode 843 is provided to cover over the entire source electrode 841 and the protective electrode 844 is provided to cover over the entire drain electrode 845, this configuration suppresses expansion of the semiconductor device size due to the design margin in formation of the gate electrode 842. This configuration thus ensures the sufficient ohmic characteristics of the source electrode 841 and the drain electrode 845, while reducing the manufacturing cost and allowing for miniaturization of the semiconductor device.

I. Ninth Embodiment

Figure 26:
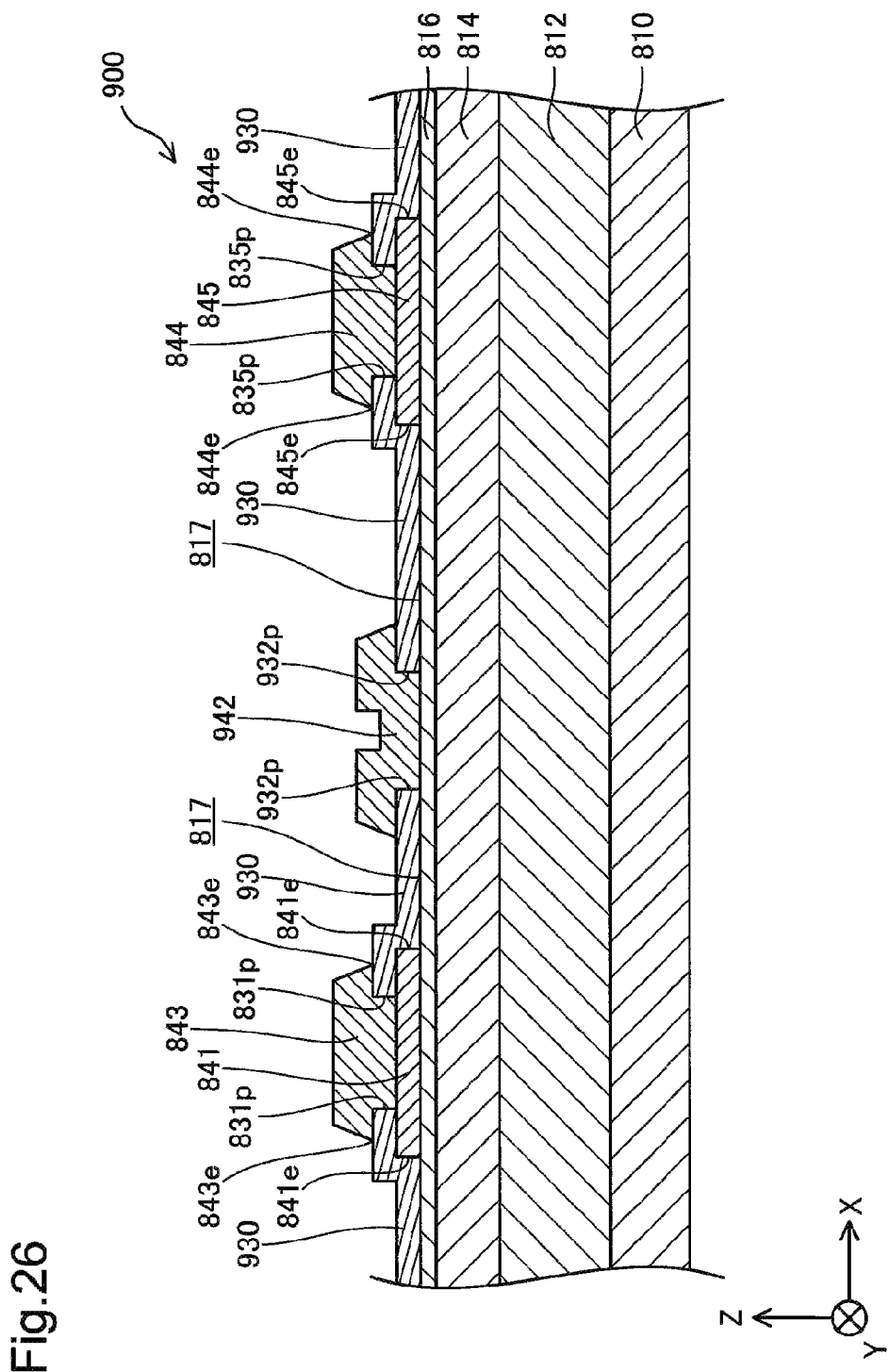
FIG. 26 is a sectional view schematically illustrating the structure of a semiconductor device according to a ninth embodiment.

FIG. 26 is a sectional view schematically illustrating the structure of a semiconductor device 900 according to a ninth embodiment. XYZ axes similar to those of FIG. 1 are shown in FIG. 26. The semiconductor device 900 is a GaN-based semiconductor device. According to this embodiment, the semiconductor device 900 is a lateral HFET (hetero-structure field effect transistor).

The semiconductor device 900 has a similar configuration to that of the semiconductor device 800 of the eighth embodiment, except that the recess 828 is not formed in the semiconductor layers 814 and 816 in the semiconductor device 900 and that the semiconductor device 900 has an insulating film 930 that is different from the insulating film 830 and a gate electrode 942 that is different from the gate electrode 842.

The insulating film 930 of the semiconductor device 900 is similar to the insulating film 830 of the eighth embodiment, except that the insulating film 930 is formed over from the surface 817 of the semiconductor layer 816 to the source electrode 841 and to the drain electrode 845 and has an opening area defined by an opening edge 932p, which is located between the source electrode 841 and the drain electrode 845.

The gate electrode 942 of the semiconductor device 900 is similar to the gate electrode 842 of the eighth embodiment, except that the gate electrode 942 is formed through an opening area defined by the opening edge 932p of the insulating film 930 and is formed over from the semiconductor layer 816 to the insulating film 930.

Like the eighth embodiment, the ninth embodiment described above ensures the sufficient ohmic characteristics of the source electrode 841 and the drain electrode 845, while reducing the manufacturing cost and allowing for miniaturization of the semiconductor device.

J. Other Embodiments

The invention is not limited to any of the embodiments, the examples and the modifications described above but may be implemented by a diversity of other configurations without departing from the scope of the invention. For example, the technical features of any of the embodiments, examples and modifications corresponding to the technical features of each of the aspects described in Summary may be replaced or combined appropriately, in order to solve part or all of the problems described above or in order to achieve part or all of the advantageous effects described above. Any of the technical features may be omitted appropriately unless the technical feature is described as essential herein.

The semiconductor device which the invention is applied to is not limited to the vertical trench MOSFET, the lateral MISFET or the lateral HFET described in the above embodiments but may be, for example, an insulating gate bipolar transistor (IGBT).

In the embodiments described above, the material of the substrate is not limited to gallium nitride (GaN) but may be, for example, any of silicon (Si), sapphire ($Al_2O_3$) and silicon carbide (SiC). In the embodiments described above, the material of each semiconductor layer is not limited to gallium nitride (GaN) but may be, for example, any of silicon (Si), silicon carbide (SiC) and gallium arsenide (GaAs).

In the above embodiments, the donor included in the n-type semiconductor is not limited to silicon (Si) but may be, for example, germanium (Ge) or oxygen (O).

In the above embodiments, the acceptor included in the p-type semiconductor is not limited to magnesium (Mg) but may be, for example, zinc (Zn) or carbon (C).

In the above embodiments, the material of the insulating film may be any material that has electrical insulating characteristics and may be, for example, at least one selected from the group consisting of silicon nitride (SiNx), aluminum oxide ($Al_2O_3$), aluminum nitride (AlN), zirconium oxide ($ZrO_2$), hafnium oxide ($HfO_2$), silicon oxynitride (SiON), aluminum oxynitride (AlON), zirconium oxynitride (ZrON) and hafnium oxynitride (HfON), as well as silicon dioxide ($SiO_2$). The insulating film may have a single-layered structure or a two-layered or multi-layered structure. The technique employed to form the insulating film is not limited to ALD but may be another technique such as ECR sputtering or plasma CVD.

In the above embodiments, the materials of the respective electrodes are not limited to those described above but may be other suitable materials.

In the fourth to the seventh embodiments described above, the body electrode 444 is described as the fourth electrode formed in the recess 429. According to another embodiment, the semiconductor layer 116 may be formed in part of the semiconductor layer 114 by ion implantation, diffusion or the like, and the body electrode 444 may be formed on the semiconductor layer 114 that is adjacent to the semiconductor layer 116 without forming the recess 429.

What is claimed is:

1. A semiconductor device comprising:
   a semiconductor layer;
   a first electrode that is in ohmic contact with part of the semiconductor layer;
   an insulating film that is formed over from the semiconductor layer to the first electrode and has an opening area on an inner side of a first edge of the first electrode;
   a second electrode that is located at a position different from the first electrode and is formed on at least one of the insulating film and the semiconductor layer; and
   a third electrode that is made of an identical component with a component of the second electrode and is formed on the first electrode through the opening area and is also formed over from the first electrode to an inner side of the first edge on the insulating film;
   wherein the semiconductor layer includes:
      a p-type semiconductor layer, and
      are n-type semiconductor layer that is adjacent to the p-layer semiconductor layer and has a surface on which the first electrode is formed,
   the semiconductor device further comprising a fourth electrode that is formed on the p-type semiconductor layer.

2. The semiconductor device according to claim 1, wherein the insulating film includes:
   a first insulating layer that is formed over from the semiconductor arr to the first electrode, and
   a second insulating layer that is formed on the first insulating layer.

3. The semiconductor device according to claim 2, wherein a component of the first insulating layer is different from a component of the second insulating layer.

4. The semiconductor device according to claim 1, wherein the insulating film includes:
   a first insulating layer that is formed on the semiconductor layer, and
   a second insulating layer that is formed over the first insulating layer to the first electrode.

5. The semiconductor device according to claim 1, wherein the first electrode comprises a source electrode, and the second electrode comprises a gate electrode.

6. The semiconductor device according to claim 1, wherein the first electrode is provided to be in contact with the fourth electrode.

7. The semiconductor device according to claim 6, wherein the opening area of the insulating film is located on an inner side of an edge of the fourth electrode.

8. The semiconductor device according to claim 1, wherein the semiconductor layer is mainly made of gallium nitride (GaN).

9. A method of manufacturing a semiconductor device, the method comprising:
   forming a semiconductor layer;
   forming a first electrode that is in ohmic contact with part of the semiconductor layer;
   forming an insulating film over from the semiconductor layer to the first electrode;
   forming an opening area in the insulating film to expose the first electrode on an inner side of a first edge of the first electrode;
   forming an electrode layer over from the insulating film to the first electrode; and
   separating the electrode layer by dry etching into a second electrode and a third electrode, the second electrode being located at a different position from the first electrode and formed on at least one of the insulating film and the semiconductor layer, a third electrode being formed over from the first electrode to an inner side of the first edge on the insulating film;
   wherein the semiconductor layer includes:
      a p-type semiconductor layer and
      an n-type semiconductor layer that is adjacent to the p-type semiconductor layer and has a surface on which the first electrode is formed,
   the method further comprising forming a fourth electrode on the p-type semiconductor layer.

10. The method of manufacturing a semiconductor device according to claim 9, the method further comprising:
    forming a first insulating layer on the semiconductor layer as part of the insulating film, prior to forming the first electrode;
    forming a first opening area in the first insulating layer to expose the semiconductor layer;
    forming the first electrode on the semiconductor layer exposed from the first opening area;
    forming a second insulating layer as part of the insulating film over from the first insulating layer to the first electrode; and
    forming a second opening area in the second insulating layer, as the opening area.

11. The method of manufacturing a semiconductor device according to claim 10, wherein a mask used for formation of the first opening area is utilized to form the first electrode.

* * * * *